US008531255B2

(12) United States Patent
Loseu

(10) Patent No.: US 8,531,255 B2
(45) Date of Patent: Sep. 10, 2013

(54) TWO-TRACK SURFACE ACOUSTIC WAVE DEVICE WITH INTERCONNECTING GRATING

(75) Inventor: Aleh Loseu, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 392 days.

(21) Appl. No.: 12/966,658

(22) Filed: Dec. 13, 2010

(65) Prior Publication Data

US 2011/0309896 A1 Dec. 22, 2011

Related U.S. Application Data

(60) Provisional application No. 61/285,775, filed on Dec. 11, 2009.

(51) Int. Cl.
*H03H 9/64* (2006.01)

(52) U.S. Cl.
USPC .................. 333/195; 333/196; 310/313 D

(58) Field of Classification Search
USPC .............. 333/195, 133, 193, 196; 310/313 D
See application file for complete search history.

(56) References Cited

U.S. PATENT DOCUMENTS

| 5,558,711 | A  | * | 9/1996  | Sakurai         | 117/84  |
|-----------|----|---|---------|-----------------|---------|
| 5,790,000 | A  | * | 8/1998  | Dai et al.      | 333/193 |
| 6,163,236 | A  | * | 12/2000 | Thomas          | 333/195 |
| 6,417,746 | B1 | * | 7/2002  | Johnson         | 333/195 |
| 6,798,318 | B1 | * | 9/2004  | Abbott et al.   | 333/195 |
| 6,919,781 | B2 | * | 7/2005  | Baier et al.    | 333/195 |
| 6,985,048 | B2 | * | 1/2006  | Takamine et al. | 333/133 |
| 7,102,468 | B2 | * | 9/2006  | Otsuka et al.   | 333/195 |
| RE39,538  | E  | * | 4/2007  | Bauer et al.    | 333/193 |
| 7,486,159 | B2 | * | 2/2009  | Fujii et al.    | 333/193 |
| 7,671,705 | B2 | * | 3/2010  | Nakazawa et al. | 333/193 |
| 8,134,426 | B1 | * | 3/2012  | Loseu et al.    | 333/195 |
| 2003/0160665 | A1 | * | 8/2003 | Hagn et al.    | 333/195 |
| 2009/0201103 | A1 | * | 8/2009 | Watanabe       | 333/193 |

FOREIGN PATENT DOCUMENTS

| JP | 11-17494    | * | 1/1999 |
| JP | 2006-186433 | * | 7/2006 |
| JP | 2007-104481 | * | 4/2007 |
| JP | 2009-65548  | * | 3/2009 |

OTHER PUBLICATIONS

English language machine translation of JP 2009-65548, published Mar. 26, 2009.*

(Continued)

*Primary Examiner* — Barbara Summons
(74) *Attorney, Agent, or Firm* — Withrow & Terranova, P.L.L.C.

(57) ABSTRACT

The present disclosure relates to a two-track surface acoustic wave (SAW) device that has a first SAW track and a second SAW track. The second SAW track may include an interconnecting grating that divides an acoustic cavity of the second SAW track into two acoustic cavities, which are acoustically coupled to one another. The first SAW track and the second SAW track may be electrically coupled to one another transversely via a first re-radiation interconnection and a second re-radiation interconnection. When the two-track SAW device is used in a bandpass filter, by including the interconnecting grating, insertion loss and roll-off response characteristics of the bandpass filter may be improved. Further, in one embodiment of the two-track SAW device, addition of capacitance between the re-radiation connections may improve return loss of the two-track SAW device.

25 Claims, 32 Drawing Sheets

(56) References Cited

OTHER PUBLICATIONS

Y.R. Roh et al.; "New Type Double Mode SAW Resonator Filters on 64 degree Y-X LiNbO3"; 1996 IEEE International Proceedings of the 50th Frequency Control Symposium, Jun. 5-7, 1996, pp. 194-198.*

A.S. Loseu; Double-Mode SAW Filters with Improved Selectivity; 2000 IEEE Ultrasonics Symposium, Oct. 2000, vol. 1, pp. 95-98.*

Bergmann, A. et al, "High Selectivity SAW Duplexer for W-CDMA Band VIII," 2008 IEEE Ultrasonics Symposium Proceedings, Nov. 2-5, 2008, pp. 590-593, IEEE.

Inoue, S. et al, "Ultra- Steep Cut-Off Double Mode SAW Filter and its Application to a PCS Duplexer," IEEE Transactions on Ultrasonics, Ferroelectrics, and Frequency Control, Sep. 2007, pp. 1882-1887, vol. 54, No. 9, IEEE.

Nakao, T. et al, "P2H-5 Small 3×2.5mm2 Sized Surface Acoustic Wave Duplexer for US-PCS with Excellent Temperature and Frequency Characteristics," 2007 IEEE Ultrasonics Symposium, Oct. 28-31, 2007, pp. 1681-1684, IEEE.

Takayama, R. et al, "US-PCS SAW Duplexer using High-Q SAW Resonator with SiO2 Coat for Stabilizing Temperature Characteristics," 2004 IEEE Ultrasonics Symposium Proceedings, Aug. 23-27, 2004, pp. 959-962, vol. 2, IEEE.

Tsutsumi, J. et al, "A Miniaturized 3×3-mm SAW Antenna Duplexer for the US-PCS Band with Temperature-Compensated LiTaO3/Sapphire Substrate," 2004 IEEE Ultrasonics Symposium, Aug. 23-27, 2004, pp. 954-958, vol. 2, IEEE.

* cited by examiner

TWO-TRACK SURFACE ACOUSTIC WAVE DEVICE WITH INTERCONNECTING GRATING

This application claims the benefit of provisional patent application Ser. No. 61/285,775, filed Dec. 11, 2009, the disclosure of which is hereby incorporated herein by reference in its entirety.

FIELD OF THE DISCLOSURE

Embodiments of the present disclosure relate to surface acoustic wave (SAW) devices, particularly SAW filters, which may be used in radio frequency (RF) communications systems.

BACKGROUND OF THE DISCLOSURE

As technology progresses, wireless devices tend to integrate more features and become increasingly ubiquitous. For example, wireless devices may include features associated with personal digital assistants (PDAs), cellular telephones, wireless internet access devices, global positioning system (GPS) receivers, and the like. Therefore, multiple radio frequency (RF) signals spanning a wide frequency range are common in many areas and may interfere with one another. Such wireless devices may be used in a number of different operating environments including operating indoors or outdoors. As a result, wireless devices may need to operate over a wide temperature range. Further, wireless devices may support one or more wireless communications protocols, such as third (3G), fourth (4G), or later generation cellular telephone protocols, GPS protocols, wireless fidelity (Wi-Fi) protocols, Bluetooth®, and the like. Some of these protocols may have tight channel spacings that require narrow channel bandwidths. Additionally, full duplex systems may transmit and receive RF signals simultaneously. In such systems, a difference between a transmit frequency and a receive frequency, called a duplex gap, may be narrow. As a result, a receive bandpass filter in a full duplex system may require a relatively narrow passband and may require a steep roll-off response when moving toward the transmit frequency to isolate receive circuitry from transmit signals. Further, since the duplex gap may be narrow, the receive bandpass filter may need to have low insertion loss in the passband toward the transmit frequency. In addition, to preserve signal integrity, a receive bandpass filter may need a clean response to minimize return loss.

Surface acoustic wave (SAW) devices are electro-mechanical devices that utilize surface acoustic waves, which travel along the surface of a substrate having some elasticity. The substrate has a relationship between an electrical signal and mechanical movement within the substrate. An applied electrical signal may be used to cause the mechanical movement, which may include surface acoustic waves, or the mechanical movement may be used to provide an electrical signal. Therefore, the substrate may be used in a transducer for transduction between an electrical signal and mechanical movement. An inter-digital transducer (IDT) is a special type of transducer used to convert an electrical signal into surface acoustic waves or to convert surface acoustic waves into an electrical signal.

A SAW track may include two or more IDTs along an acoustic cavity, such that the IDTs are acoustically coupled to one another. A first IDT in the SAW track may receive an input signal and a second IDT in the SAW track may provide an output signal based on surface acoustic waves that are coupled between the IDTs. Multiple SAW tracks may be electrically coupled to one another to form a SAW device, such as a SAW bandpass filter, which may be used as a receive bandpass filter in a full duplex system. Manufacturing costs of a SAW device may be directly related to the size of the SAW device, which is related to the sizes and spacings of IDTs used in the SAW device. Such sizes and spacings may be related to frequencies of surface acoustic waves in the SAW device. Thus, there is a need for a SAW device having a small size, which may be used in a receive bandpass filter having minimal insertion loss, having minimal return loss, having a steep roll-off response toward a transmit frequency, and having a wide operating temperature range.

SUMMARY OF THE EMBODIMENTS

The present disclosure relates to a two-track surface acoustic wave (SAW) device that has a first SAW track and a second SAW track. The second SAW track may include an interconnecting grating that divides an acoustic cavity of the second SAW track into two acoustic cavities, which are acoustically coupled to one another. The first SAW track and the second SAW track may be electrically coupled to one another transversely via a first re-radiation interconnection and a second re-radiation interconnection. When the two-track SAW device is used in a bandpass filter, by including the interconnecting grating, insertion loss and roll-off response characteristics of the bandpass filter may be improved. Further, in one embodiment of the two-track SAW device, addition of capacitance between the re-radiation connections may improve return loss of the two-track SAW device.

Additionally, in one embodiment of the two-track SAW device, one SAW track has three inter-digital transducers (IDTs) and the other SAW track has four IDTs. The three IDT SAW track may provide a single-ended input and the four IDT SAW track may provide a differential output. Conversely, the four IDT SAW track may provide a differential input and the three IDT SAW track may provide a single-ended output. In an alternate embodiment of the two-track SAW device, both SAW tracks have four IDTs. One four IDT SAW track may provide a differential input and the other four IDT SAW track may provide a differential output. Gratings at the ends of either or both of the SAW tracks may be left floating or electrically coupled to external ground connection nodes. In an additional embodiment of the two-track SAW device, one SAW track may have more than three IDTs and the other SAW track may have more than four IDTs. In one embodiment of the two-track SAW device, the two-track SAW device is used in a two-track SAW filter, which may be a receive bandpass filter as part of a duplexer. By incorporating one or more embodiments of the present disclosure, a full operating temperature range, ultra narrow gap duplexer may be possible without using complicated and expensive temperature compensating techniques.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a two-track surface acoustic wave (SAW) device that has a first SAW track and a second SAW track. The second SAW track may include an interconnecting grating that divides an acoustic cavity of the second SAW track into two acoustic cavities, which are acoustically coupled to one another. The first SAW track and the second SAW track may be electrically coupled to one another transversely via a first re-radiation interconnection and a second re-radiation interconnection. When the two-track SAW device is used in a bandpass filter, by including the interconnecting grating, insertion loss and roll-off response characteristics of the bandpass filter may be improved. Further, in one embodiment of the two-track SAW device, addition of capacitance between the re-radiation connections may improve return loss of the two-track SAW device.

Additionally, in one embodiment of the two-track SAW device, one SAW track has three inter-digital transducers (IDTs) and the other SAW track has four IDTs. The three IDT SAW track may provide a single-ended input and the four IDT SAW track may provide a differential output. Conversely, the four IDT SAW track may provide a differential input and the three IDT SAW track may provide a single-ended output. In an alternate embodiment of the two-track SAW device, both SAW tracks have four IDTs. One four IDT SAW track may provide a differential input and the other four IDT SAW track may provide a differential output. Gratings at the ends of either or both of the SAW tracks may be left floating or electrically coupled to external ground connection nodes. In an additional embodiment of the two-track SAW device, one SAW track may have more than three IDTs and the other SAW track may have more than four IDTs. In one embodiment of the two-track SAW device, the two-track SAW device is used in a two-track SAW filter, which may be a receive bandpass filter as part of a duplexer. By incorporating one or more embodiment of the present disclosure, a full operating temperature range, ultra narrow gap duplexer may be possible without using complicated and expensive temperature compensating techniques.

Figure 1:
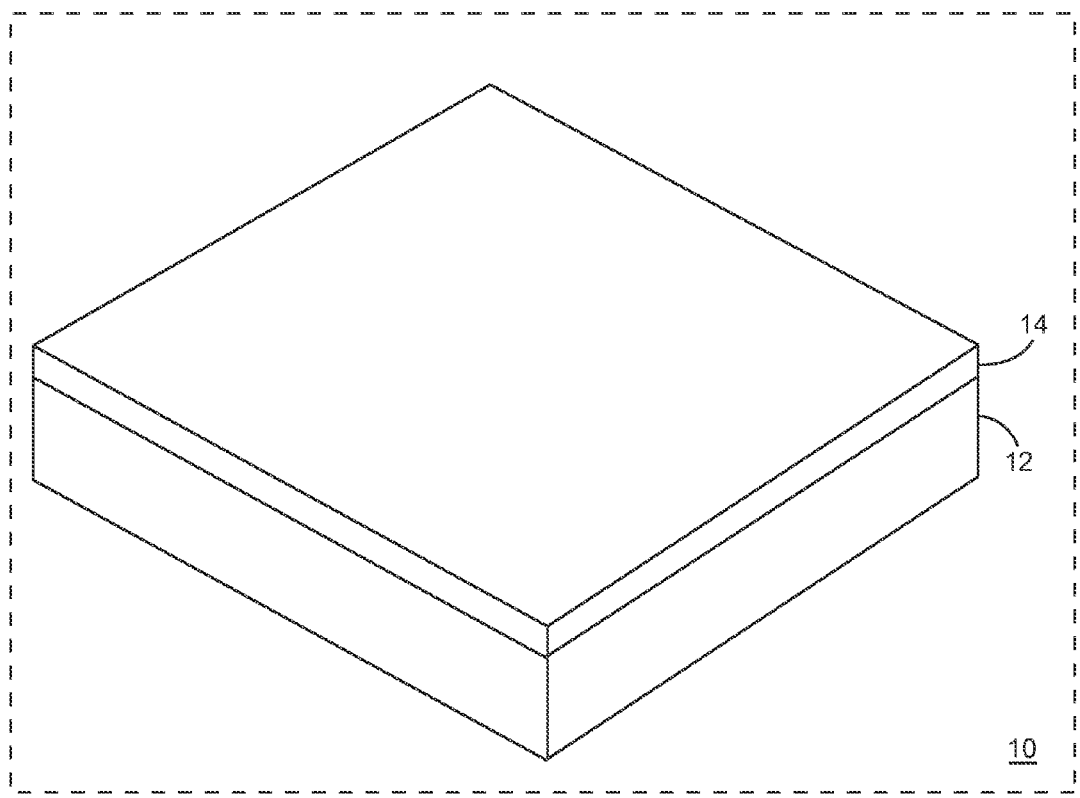
FIG. 1 shows an isometric view of a piezoelectric wafer that may be suitable for fabricating surface acoustic wave (SAW) devices according to the prior art.

FIG. 1 shows an isometric view of a piezoelectric wafer 10 that may be suitable for fabricating SAW devices according to the prior art. A substrate 12 provides material upon which SAW devices are formed. A first conductive layer 14 is over the substrate 12 and is patterned to provide electrical connections and conductive elements of the SAW devices.

Figure 2:
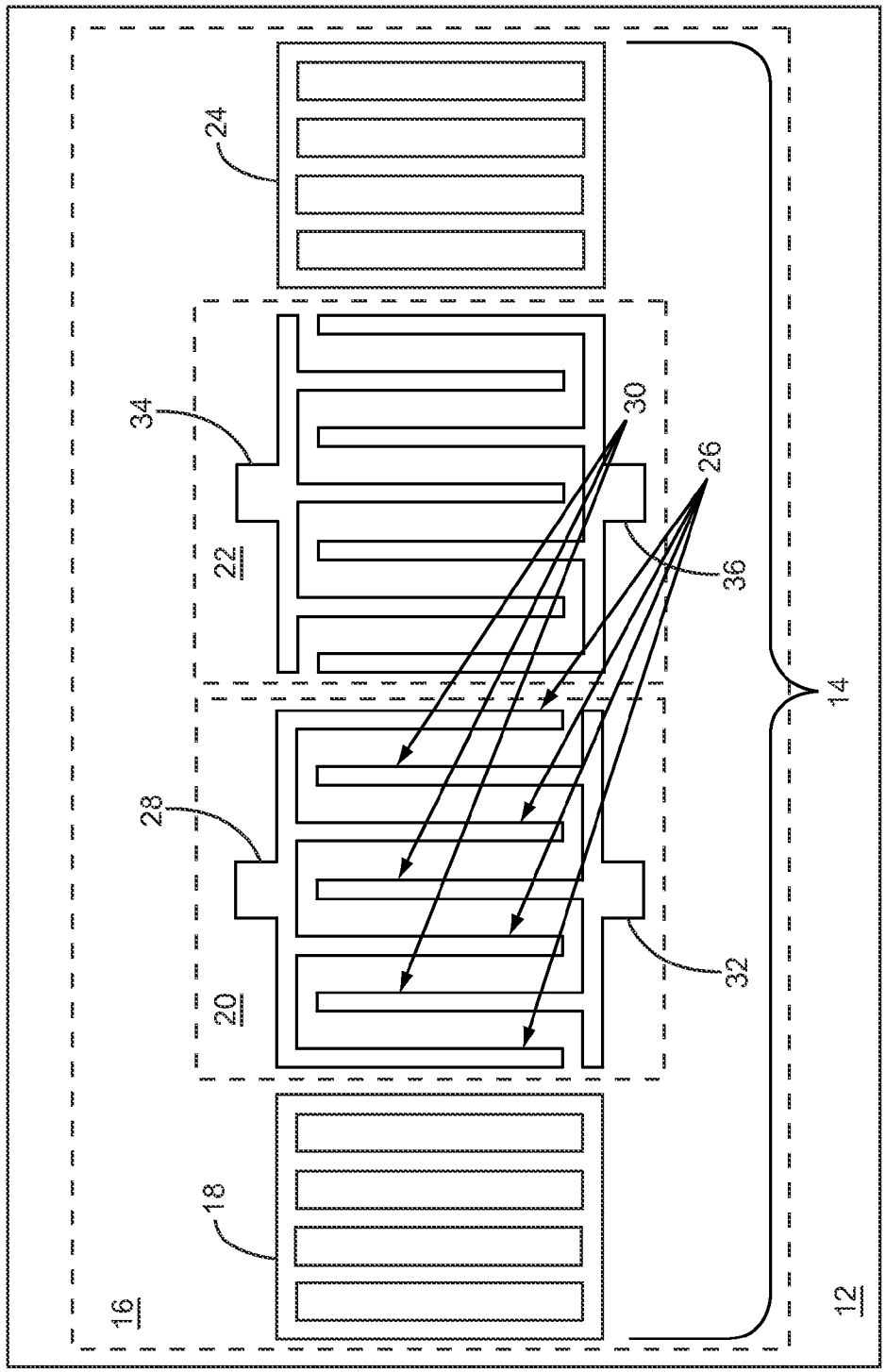
FIG. 2 shows a top-view of the substrate of the piezoelectric wafer illustrated in FIG. 1 according to the prior art.

FIG. 2 shows a top-view of the first conductive layer 14 over the substrate 12, such that parts of the first conductive layer 14 are removed to form a single-track SAW device 16, according to the prior art. The single-track SAW device 16 includes a first grating 18, a first IDT 20 adjacent to the first grating 18, a second IDT 22 adjacent to the first IDT 20, and a second grating 24 adjacent to the second IDT 22. The first IDT 20 has a first set of inter-digitated fingers (IDFs) 26 electrically coupled to a first connection node (FCN) 28 and a second set of IDFs 30 electrically coupled to a second connection node (SCN) 32. The first set of IDFs 26 are interlaced with, electrically isolated from, and acoustically coupled to the second set of IDFs 30.

The first and the second sets of IDFs 26, 30 over the substrate 12 form the first IDT 20, such that an electrical signal applied between the FCN 28 and the SCN 32 may generate surface acoustic waves in the substrate 12. Likewise, surface acoustic waves in the substrate 12 may generate an electrical signal between the FCN 28 and the SCN 32. Similar to the first IDT 20, the second IDT 22 has two sets of IDFs electrically coupled to a third connection node (TCN) 34 and a fourth connection node (4CN) 36. The first and the second gratings 18, 24 may include multiple grating fingers that are about parallel to the IDFs of the first and the second IDTs 20, 22.

Figures 3A, 3B:
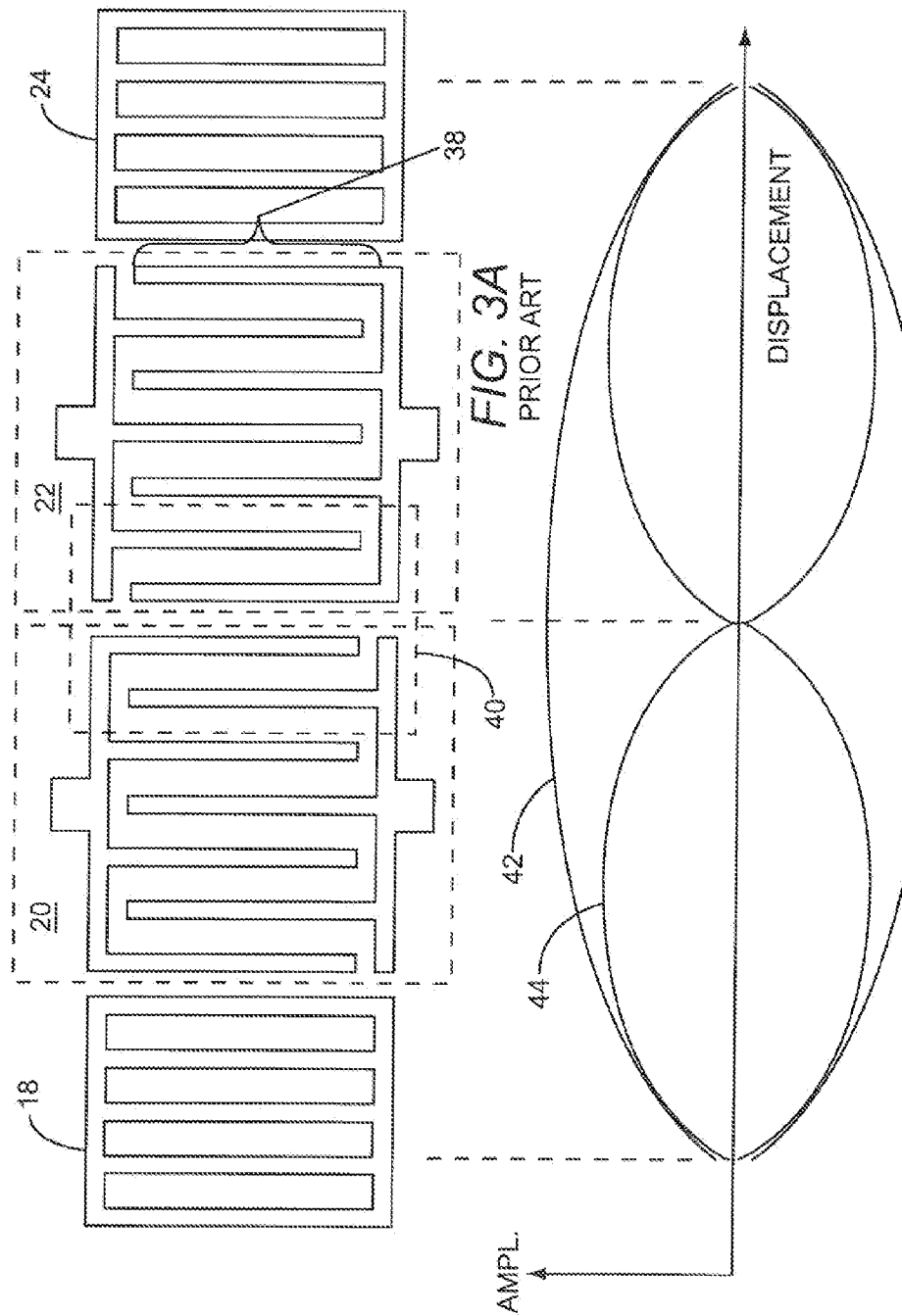
FIG. 3A shows dual-mode SAW coupling between a first inter-digital transducer (IDT) and a second IDT illustrated in FIG. 2 according to the prior art.
FIG. 3B is a graph showing a first mode and a second mode of a single-track SAW device illustrated in FIG. 3A according to the prior art.

The single-track SAW device 16 illustrated in FIG. 2 may function as a dual-mode SAW device (DMSD) as illustrated in FIGS. 3A and 3B. FIG. 3A shows dual-mode SAW coupling between the first IDT 20 and the second IDT 22 illustrated in FIG. 2 according to the prior art. Each IDF of the first and the second IDTs 20, 22 has a finger length 38 that determines a width of an acoustic aperture of the single-track SAW device 16. An input impedance of the first IDT 20 at frequencies in a passband of the single-track SAW device 16 is inversely related to the width of the acoustic aperture. To achieve a low input impedance, as required in some RF communications systems, a wide acoustic aperture is required, which requires long finger lengths 38. However, increasing finger lengths 38 increases insertion loss; therefore, architectures that reduce insertion loss while providing a low input impedance may be desirable. The single-track SAW device 16 operating as a DMSD relies on dual-mode SAW coupling between the first and the second IDTs 20, 22. A chirping region 40 overlaps the first and the second IDTs 20, 22 and provides the appropriate SAW coupling. In the chirping region 40, the widths of individual fingers, the spacing between fingers, or both may vary to provide SAW coupling that varies with frequency, thereby providing a desired frequency response of the single-track SAW device 16. The first and the second gratings 18, 24 may substantially constrain surface acoustic wave propagation to within the single-track SAW device 16.

FIG. 3B is a graph showing a first mode and a second mode of the single-track SAW device 16 illustrated in FIG. 3A according to the prior art. The first mode is a symmetric mode having a symmetric mode response 42 that has an amplitude peak at the center of the chirping region 40. The second mode is an anti-symmetric mode having an anti-symmetric mode response 44 that has an amplitude valley at the center of the chirping region 40.

Figure 4:
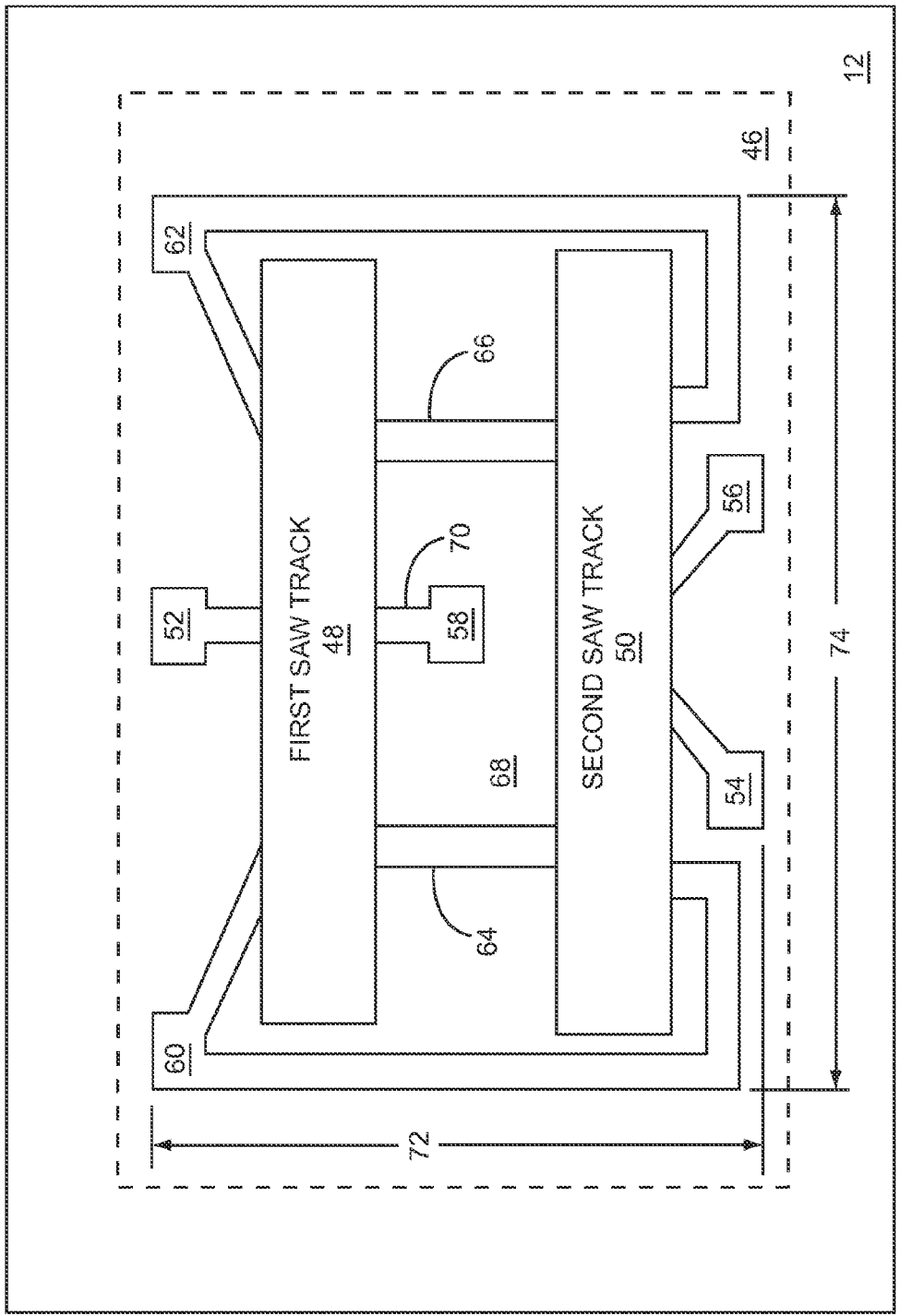
FIG. 4 shows a top-view of an internal ground connection node two-track SAW device according to the prior art.

FIG. 4 shows a top-view of a two-track SAW device 46 according to the prior art. The two-track SAW device 46 includes a first SAW track 48 disposed on the substrate 12, a second SAW track 50 disposed on the substrate 12, a first connection node 52 disposed on the substrate 12 and electrically coupled to the first SAW track 48, a second connection node 54 disposed on the substrate 12 and electrically coupled to the second SAW track 50, a third connection node 56 disposed on the substrate 12 and electrically coupled to the second SAW track 50, an internal ground connection node 58 disposed on the substrate 12, a first ground connection node 60 disposed on the substrate 12 and electrically coupled to the first and the second SAW tracks 48, 50, a second ground connection node 62 disposed on the substrate 12 and electrically coupled to the first and the second SAW tracks 48, 50, a first re-radiation interconnection 64 disposed on the substrate 12 and electrically coupled between the first and the second SAW tracks 48, 50, a second re-radiation interconnection 66 disposed on the substrate 12 and electrically coupled between the first and the second SAW tracks 48, 50, an internal region 68 defined by the first and the second SAW tracks 48, 50 and the first and the second re-radiation interconnections 64, 66, and an internal ground interconnection 70 disposed on the substrate 12 and electrically coupled between the internal ground connection node 58 and the first SAW track 48. The internal ground interconnection 70 and the internal ground connection node 58 are both located in the internal region 68. The two-track SAW device 46 has a SAW device length 72 and a SAW device width 74. Either the first SAW track 48, the second SAW track 50, or both may function as a dual-mode SAW track. Either the first SAW track 48, the second SAW track 50, or both may function as a multi-mode SAW track. As such, the two-track SAW device 46 may function as a DMSD or a multi-mode SAW device (MMSD).

Figure 5:
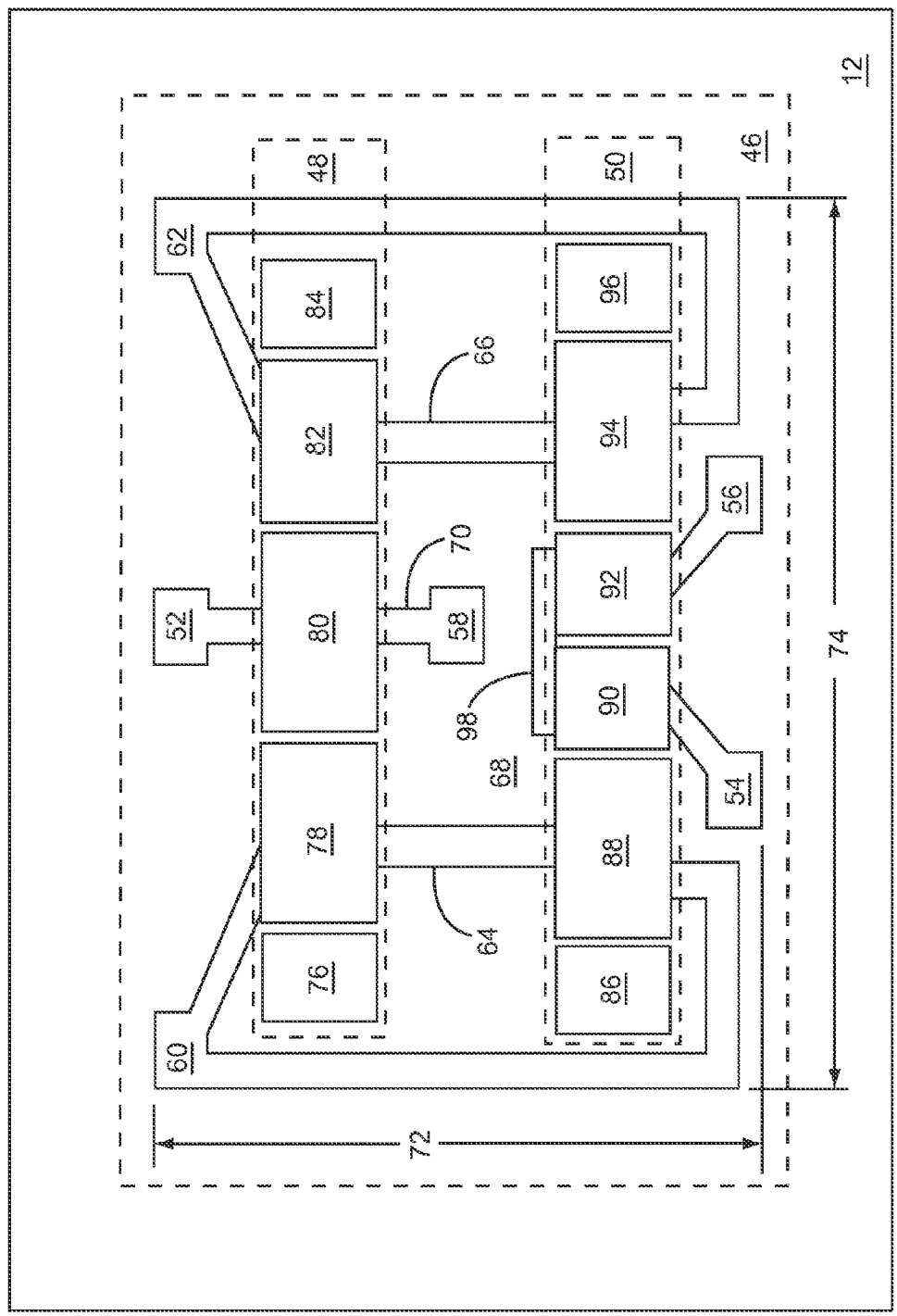
FIG. 5 shows a top-view of details of the internal ground connection node two-track SAW device illustrated in FIG. 4 according to the prior art.

FIG. 5 shows a top-view of details of the two-track SAW device 46 illustrated in FIG. 4 according to the prior art. The first SAW track 48 includes a first grating 76, a first IDT 78 adjacent to the first grating 76, a second IDT 80 adjacent to the first IDT 78, a third IDT 82 adjacent to the second IDT 80, and a second grating 84 adjacent to the third IDT 82. The second SAW track 50 includes a third grating 86, a fourth IDT 88 adjacent to the third grating 86, a fifth IDT 90 adjacent to the fourth IDT 88, a sixth IDT 92 adjacent to the fifth IDT 90, a seventh IDT 94 adjacent to the sixth IDT 92, and a fourth grating 96 adjacent to the seventh IDT 94. The first, the second, the third, and the fourth gratings 76, 84, 86, 96 may be left floating. A second set of IDFs 30 (FIG. 2) of the first IDT 78 may be electrically coupled to the first ground connection node 60. A first set of IDFs 26 (FIG. 2) of the first IDT 78 may be electrically coupled to a first set of IDFs 26 of the fourth IDT 88 through the first re-radiation interconnection 64. A second set of IDFs 30 of the fourth IDT 88 may be electrically coupled to the first ground connection node 60. A second set of IDFs 30 of the second IDT 80 may be electrically coupled to the internal ground connection node 58 through the internal ground interconnection 70. A first set of IDFs 26 of the second IDT 80 may be electrically coupled to the first connection node 52.

A second set of IDFs 30 of the third IDT 82 may be electrically coupled to the second ground connection node 62. A first set of IDFs 26 of the third IDT 82 may be electrically coupled to a first set of IDFs 26 of the seventh IDT 94 through the second re-radiation interconnection 66. A second set of IDFs 30 of the seventh IDT 94 may be electrically coupled to the second ground connection node 62. A first set of IDFs 26 of the fifth IDT 90 may be electrically coupled to the second connection node 54. A first set of IDFs 26 of the sixth IDT 92 may be electrically coupled to the third connection node 56. The two-track SAW device 46 may further include a first electrical interconnection 98 disposed on the substrate 12. A second set of IDFs 30 of the fifth IDT 90 may be electrically coupled to a second set of IDFs 30 of the sixth IDT 92 through the first electrical interconnection 98 to provide a signal path between the second and the third connection nodes 54, 56. The first re-radiation interconnection 64, the first IDT 78, and the fourth IDT 88 form a first re-radiating pass between the first SAW track 48 and the second SAW track 50. The second re-radiation interconnection 66, the third IDT 82, and the seventh IDT 94 form a second re-radiating pass between the first SAW track 48 and the second SAW track 50.

Figure 6:
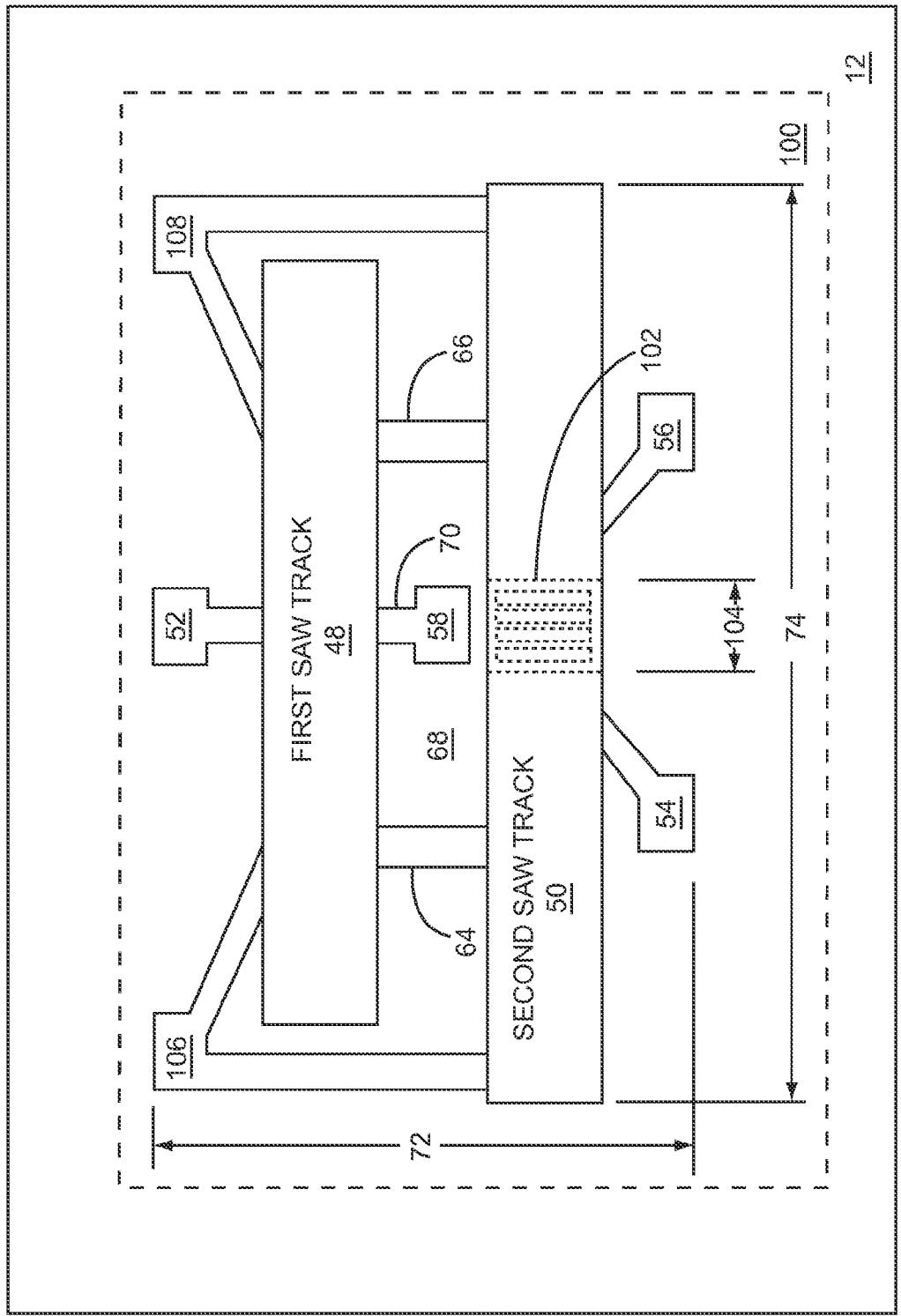
FIG. 6 shows a top-view of an expanded two-track SAW device according to one embodiment of the present disclosure.

FIG. 6 shows a top-view of an expanded two-track SAW device 100 according to one embodiment of the present disclosure. The expanded two-track SAW device 100 includes the substrate 12, the first SAW track 48 disposed on the substrate 12, the second SAW track 50 disposed on the substrate 12 and including an interconnecting grating 102 having an interconnecting ground grating length 104, the first connection node 52 disposed on the substrate 12 and electrically coupled to the first SAW track 48, the second connection node 54 disposed on the substrate 12 and electrically coupled to the second SAW track 50, the third connection node 56 disposed on the substrate 12 and electrically coupled to the second SAW track 50, a first external ground connection node 106 disposed over the substrate 12 and electrically coupled to the first and the second SAW tracks 48, 50, a second external ground connection node 108 disposed over the substrate 12 and electrically coupled to the first and the second SAW tracks 48, 50, the first re-radiation interconnection 64 disposed over the substrate 12 and electrically coupled between the first and the second SAW tracks 48, 50, the second re-radiation interconnection 66 disposed over the substrate 12 and electrically coupled between the first and the second SAW tracks 48, 50, the internal region 68 defined by the first and the second SAW tracks 48, 50 and the first and the second re-radiation interconnections 64, 66, and the internal ground interconnection 70 disposed on the substrate 12 and electrically coupled between the first SAW track 48 and the internal ground connection node 58 disposed over the substrate 12. When the expanded two-track SAW device 100 is used in a bandpass filter, the inclusion of the interconnecting grating 102 may improve insertion loss and roll-off response characteristics of the bandpass filter.

In alternate embodiments of the expanded two-track SAW device 100, any or all of the first re-radiation interconnection 64, the second re-radiation interconnection 66, the first external ground connection node 106, the second external ground connection node 108, and the internal ground connection node 58 may be disposed on the substrate 12.

The expanded two-track SAW device 100 has a SAW device length 72 and a SAW device width 74. Either the first SAW track 48, the second SAW track 50, or both may function as a dual-mode SAW track. Either the first SAW track 48, the second SAW track 50, or both may function as a multi-mode SAW track. As such, the expanded two-track SAW device 100 may function as a DMSD or a MMSD. In a first exemplary embodiment of the interconnecting grating 102, the interconnecting ground grating length 104 is greater than one wavelength of a surface acoustic wave of the expanded two-track SAW device 100. In a second exemplary embodiment of the interconnecting grating 102, the interconnecting ground grating length 104 is greater than ten wavelengths of the surface acoustic wave of the expanded two-track SAW device 100. In a third exemplary embodiment of the interconnecting grating 102, the interconnecting ground grating length 104 is greater than twenty wavelengths of the surface acoustic wave of the expanded two-track SAW device 100. In a fourth exemplary embodiment of the interconnecting grating 102, the interconnecting ground grating length 104 is between about sixteen and about thirty wavelengths of the surface acoustic wave of the expanded two-track SAW device 100.

Figure 7:
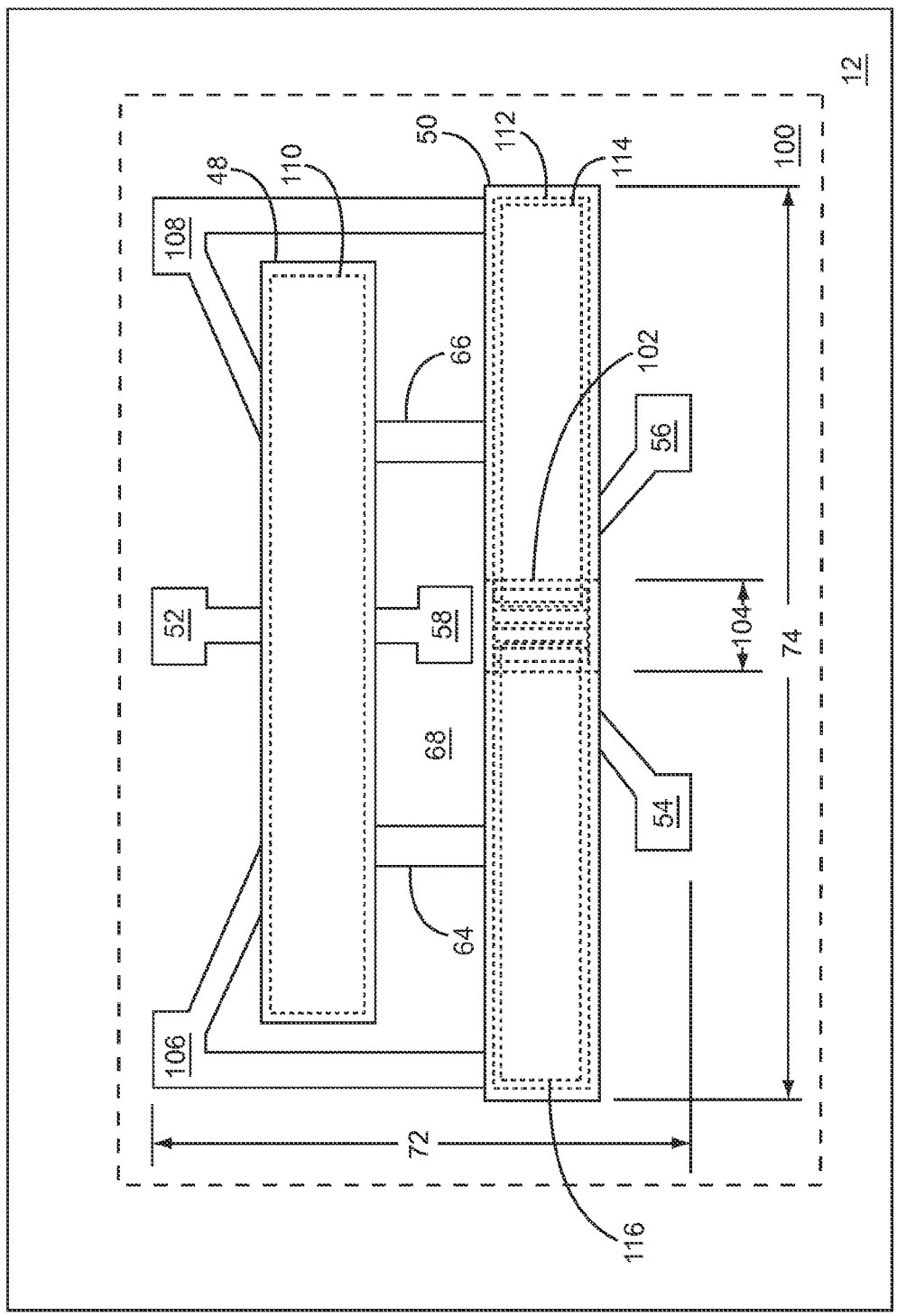
FIG. 7 shows details of a first SAW track and a second SAW track illustrated in FIG. 6 according to one embodiment of the first SAW track and one embodiment of the second SAW track, respectively.

FIG. 7 shows details of the first SAW track 48 and the second SAW track 50 illustrated in FIG. 6 according to one embodiment of the first SAW track 48 and one embodiment of the second SAW track 50, respectively. The first SAW track 48 has a first acoustic cavity 110 and the second SAW track 50 has a second acoustic cavity 112, which is divided into a third acoustic cavity 114 and a fourth acoustic cavity 116 by the interconnecting grating 102. The third acoustic cavity 114 and the fourth acoustic cavity 116 are acoustically coupled to one another.

Figure 8:
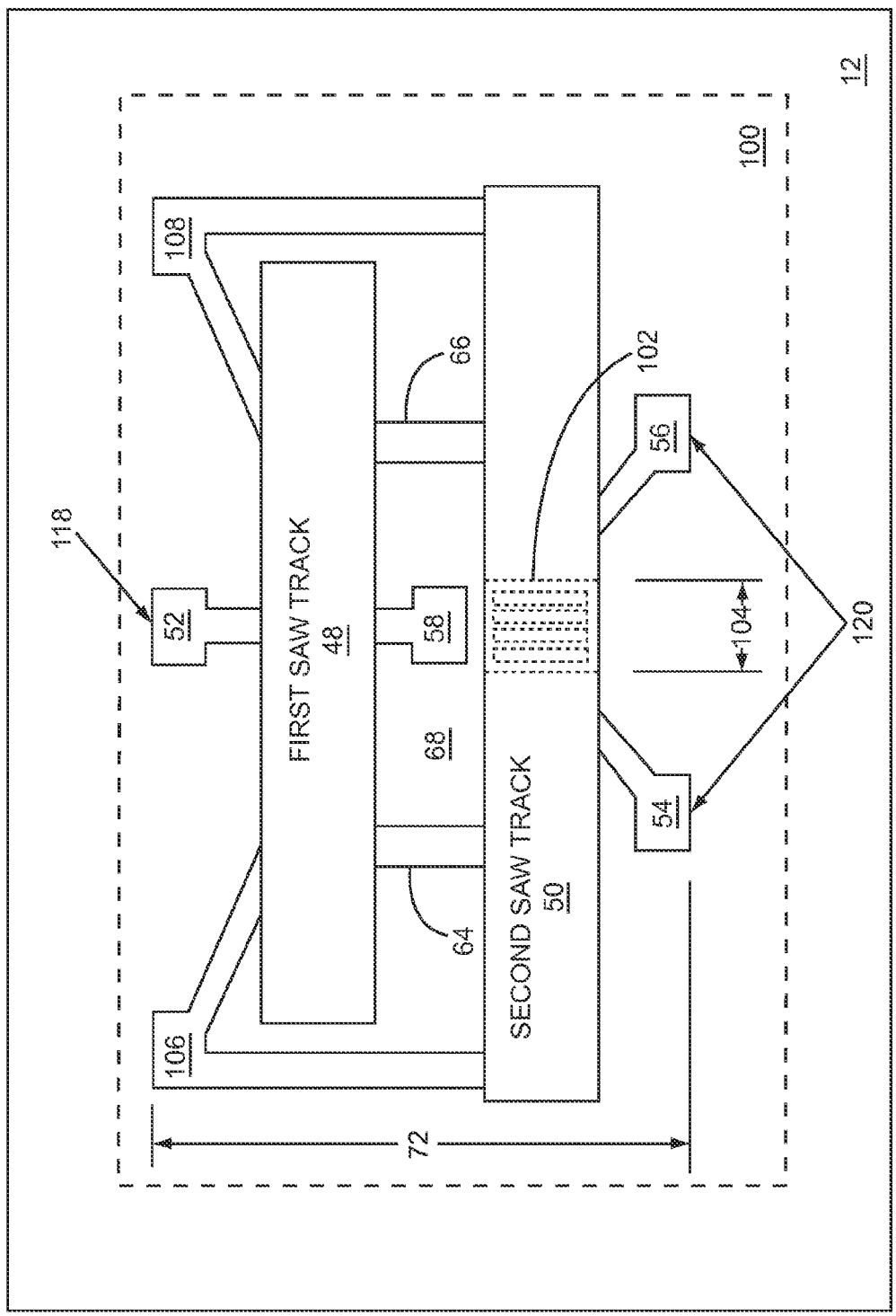
FIG. 8 shows details of the expanded two-track SAW device illustrated in FIG. 6 according to one embodiment of the expanded two-track SAW device.

FIG. 8 shows details of the expanded two-track SAW device 100 illustrated in FIG. 6 according to one embodiment of the expanded two-track SAW device 100. The first connection node 52 provides a single-ended input 118 to the expanded two-track SAW device 100, and the second and the third connection nodes 54, 56 provide a differential output 120 from the expanded two-track SAW device 100.

Figure 9:
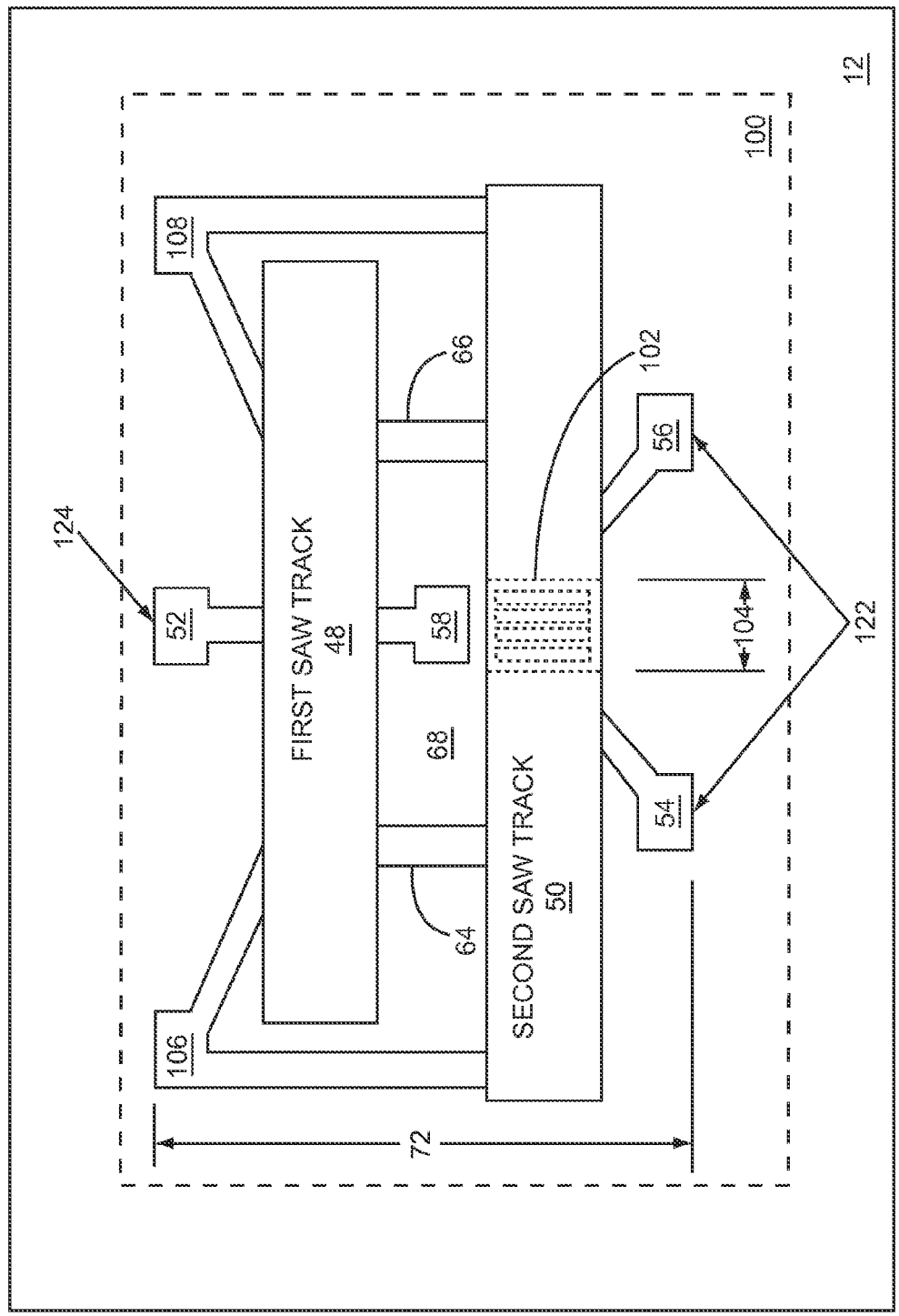
FIG. 9 shows details of the expanded two-track SAW device illustrated in FIG. 6 according to an alternate embodiment of the expanded two-track SAW device.

FIG. 9 shows details of the expanded two-track SAW device 100 illustrated in FIG. 6 according to an alternate embodiment of the expanded two-track SAW device 100. The second and the third connection nodes 54, 56 provide a differential input 122 to the expanded two-track SAW device 100, and the first connection node 52 provides a single-ended output 124 from the expanded two-track SAW device 100.

Figure 10:
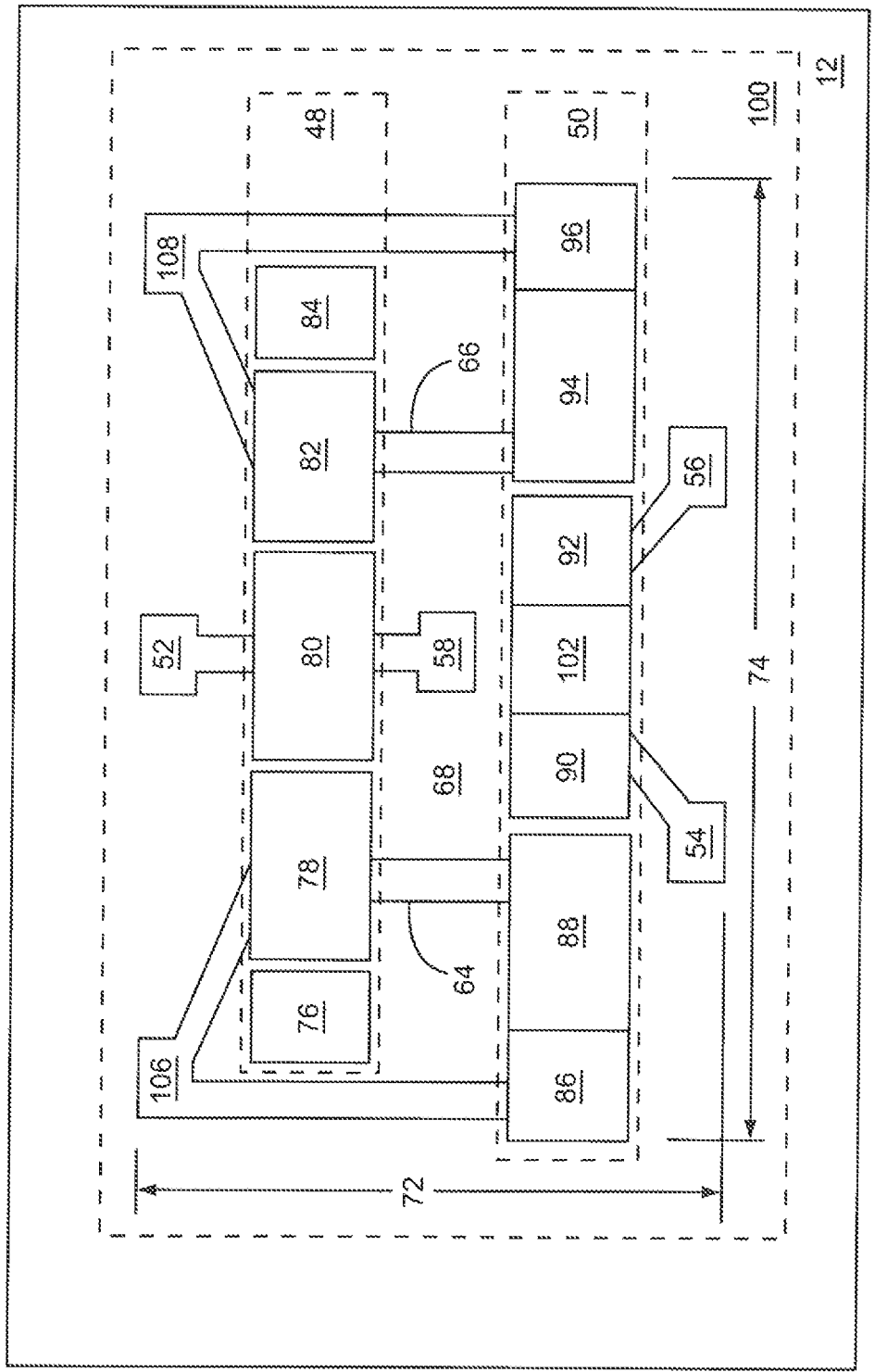
FIG. 10 shows details of the first SAW track and the second SAW track illustrated in FIG. 6 according to an alternate embodiment of the first SAW track and an alternate embodiment of the second SAW track, respectively.

FIG. 10 shows details of the first SAW track 48 and the second SAW track 50 illustrated in FIG. 6 according to an alternate embodiment of the first SAW track 48 and an alternate embodiment of the second SAW track 50, respectively. The first SAW track 48 includes the first grating 76, the first IDT 78 adjacent to the first grating 76, the second IDT 80 adjacent to the first IDT 78, the third IDT 82 adjacent to the second IDT 80, and the second grating 84 adjacent to the third IDT 82. The second SAW track 50 includes the third grating 86, the fourth IDT 88 adjacent to the third grating 86, the fifth IDT 90 adjacent to the fourth IDT 88, the interconnecting grating 102 adjacent to the fifth IDT 90, the sixth IDT 92 adjacent to the interconnecting grating 102, the seventh IDT 94 adjacent to the sixth IDT 92, and the fourth grating 96 adjacent to the seventh IDT 94. The first and the second gratings 76, 84 are floating. The third grating 86 is electrically coupled to the first external ground connection node 106, and the fourth grating 96 is electrically coupled to the second external ground connection node 108. The first SAW track 48 illustrated in FIG. 10 is a three-IDT track and the second SAW track 50 illustrated in FIG. 10 is a four-IDT track.

Grounding IDFs 136 (FIG. 19) of the first IDT 78 may be electrically coupled to the first external ground connection node 106. Active IDFs 134 (FIG. 19) of the first IDT 78 may be electrically coupled to active IDFs 134 (FIG. 19) of the fourth IDT 88 through the first re-radiation interconnection 64. Grounding IDFs 136 (FIG. 19) of the fourth IDT 88 may be electrically coupled to the first external ground connection node 106 through the third grating 86. Grounding IDFs 136 (FIG. 19) of the second IDT 80 may be electrically coupled to the internal ground connection node 58. Active IDFs 134 (FIG. 19) of the second IDT 80 may be electrically coupled to the first connection node 52.

Grounding IDFs 136 (FIG. 19) of the third IDT 82 may be electrically coupled to the second external ground connection node 108. Active IDFs 134 (FIG. 19) of the third IDT 82 may be electrically coupled to active IDFs 134 (FIG. 19) of the seventh IDT 94 through the second re-radiation interconnection 66. Grounding IDFs 136 (FIG. 19) of the seventh IDT 94 may be electrically coupled to the second external ground connection node 108 through the fourth grating 96. Active IDFs 134 (FIG. 19) of the fifth IDT 90 may be electrically coupled to the second connection node 54. Active IDFs 134 (FIG. 19) of the sixth IDT 92 may be electrically coupled to the third connection node 56. Grounding IDFs 136 (FIG. 19) of the fifth IDT 90 may be electrically coupled to the interconnecting grating 102 and grounding IDFs 136 (FIG. 19) of the sixth IDT 92 may be electrically coupled to the interconnecting grating 102.

By including the interconnecting grating 102, the expanded two-track SAW device 100 illustrated in FIG. 10 tends to have a larger SAW device width 74 than the two-track SAW device 46 illustrated in FIG. 5. However, by electrically coupling the grounding IDFs 136 (FIG. 19) of the third IDT 82 to the fourth grating 96 and by electrically coupling the grounding IDFs 136 (FIG. 19) of the first IDT 78 to the third grating 86, the expanded two-track SAW device 100 illustrated in FIG. 10 tends to have a smaller SAW device width 74 than the two-track SAW device 46 illustrated in FIG. 5. As a result the SAW device width 74 of the expanded two-track SAW device 100 illustrated in FIG. 10 may be about equal to the SAW device width 74 of the two-track SAW device 46 illustrated in FIG. 5.

In a first embodiment of the expanded two-track SAW device 100 illustrated in FIG. 10, the first connection node 52 provides the single-ended input 118 (FIG. 8) to the expanded two-track SAW device 100, and the second and the third connection nodes 54, 56 provide the differential output 120 (FIG. 8) from the expanded two-track SAW device 100. When a single-ended alternating current (AC) input signal is applied between the first connection node 52 and the internal ground connection node 58, the second IDT 80 may convert the single-ended AC input signal into surface acoustic waves in the first SAW track 48. The first and the third IDTs 78, 82 may convert the surface acoustic waves in the first SAW track 48 into a first AC signal on the first re-radiation interconnection 64 and a second AC signal on the second re-radiation interconnection 66, respectively. The fourth and the seventh IDTs 88, 94 may convert the first and the second AC signals, respectively, into surface acoustic waves in the second SAW track 50. The fifth and the sixth IDTs 90, 92 may convert the surface acoustic waves in the second SAW track 50 into a differential AC output signal on the second and the third connection nodes 54, 56, respectively.

In a second embodiment of the expanded two-track SAW device 100 illustrated in FIG. 10, the second and the third connection nodes 54, 56 provide the differential input 122 (FIG. 9) to the expanded two-track SAW device 100, and the first connection node 52 provides the single-ended output 124 (FIG. 9) from the expanded two-track SAW device 100. When a differential AC input signal is applied between second and the third connection nodes 54, 56, the fifth and the sixth IDTs 90, 92, respectively, may convert the differential AC input signal into surface acoustic waves in the second SAW track 50. The fourth and the seventh IDTs 88, 94 may convert the surface acoustic waves in the second SAW track 50 into first and second AC signals on the first and the second re-radiation interconnections 64, 66, respectively. The first and the third IDTs 78, 82 may convert the first and the second AC signals, respectively, into surface acoustic waves in the first SAW track 48. The second IDT 80 may convert the surface acoustic waves in the first SAW track 48 into a single-ended AC output signal between the first connection node 52 and the internal ground connection node 58.

Figure 11:
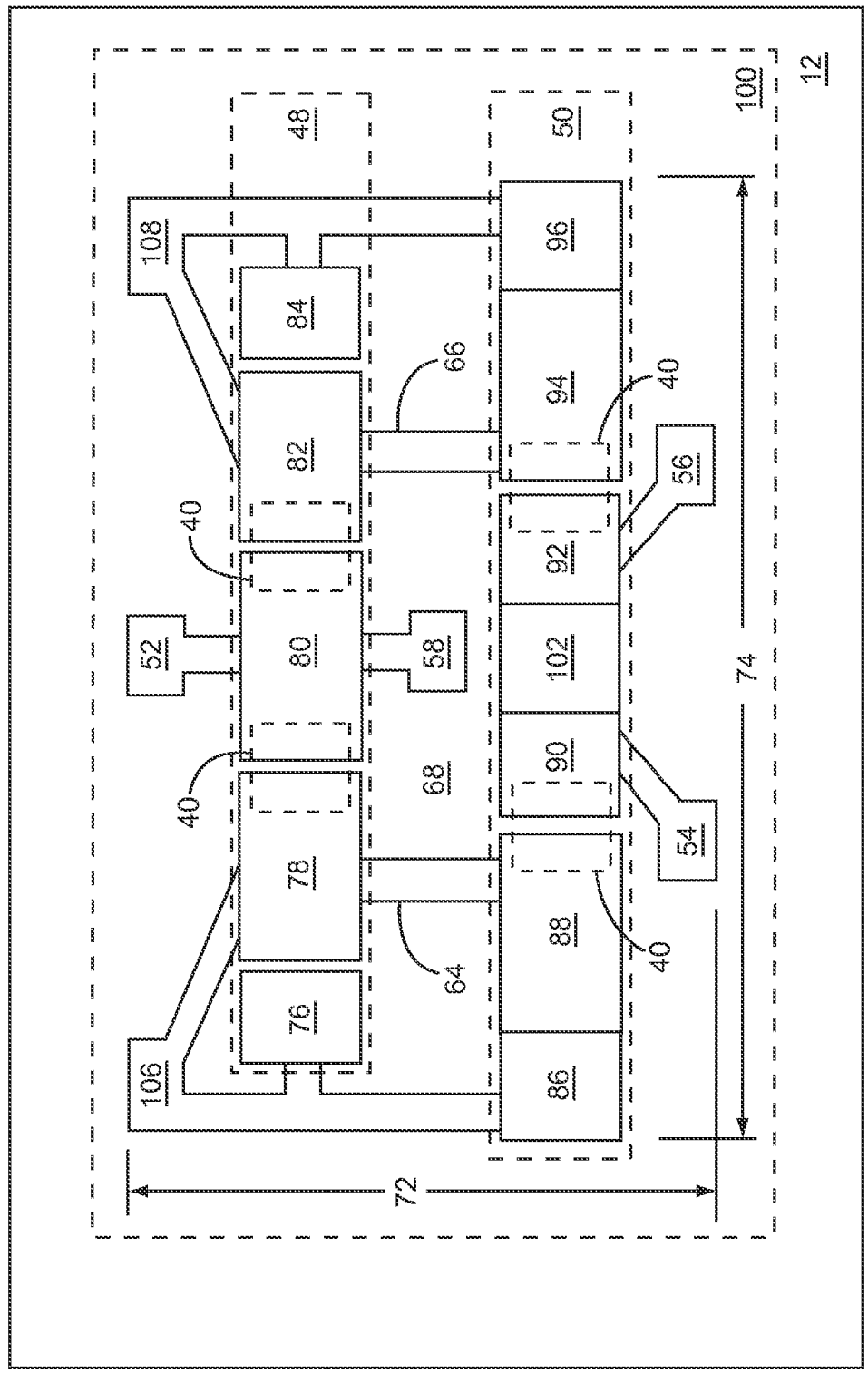
FIG. 11 shows details of the expanded two-track SAW device according to an alternate embodiment of the present disclosure.

FIG. 11 shows details of the expanded two-track SAW device 100 according to an alternate embodiment of the present disclosure. The expanded two-track SAW device 100 illustrated in FIG. 11 is similar to the expanded two-track SAW device 100 illustrated in FIG. 10, except in the expanded two-track SAW device 100 illustrated in FIG. 11, the first grating 76 is electrically coupled to the first external ground connection node 106 and the second grating 84 is electrically coupled to the second external ground connection node 108. The expanded two-track SAW device 100 illustrated in FIG. 11 further includes chirping regions 40 between the first IDT 78 and the second IDT 80, between the second IDT 80 and the third IDT 82, between the fourth IDT 88 and the fifth IDT 90, and between the sixth IDT 92 and the seventh IDT 94 to provide appropriate SAW coupling between the first IDT 78 and the second IDT 80, between the second IDT 80 and the third IDT 82, between the fourth IDT 88 and the fifth IDT 90, and between the sixth IDT 92 and the seventh IDT 94, respectively.

Figure 12:
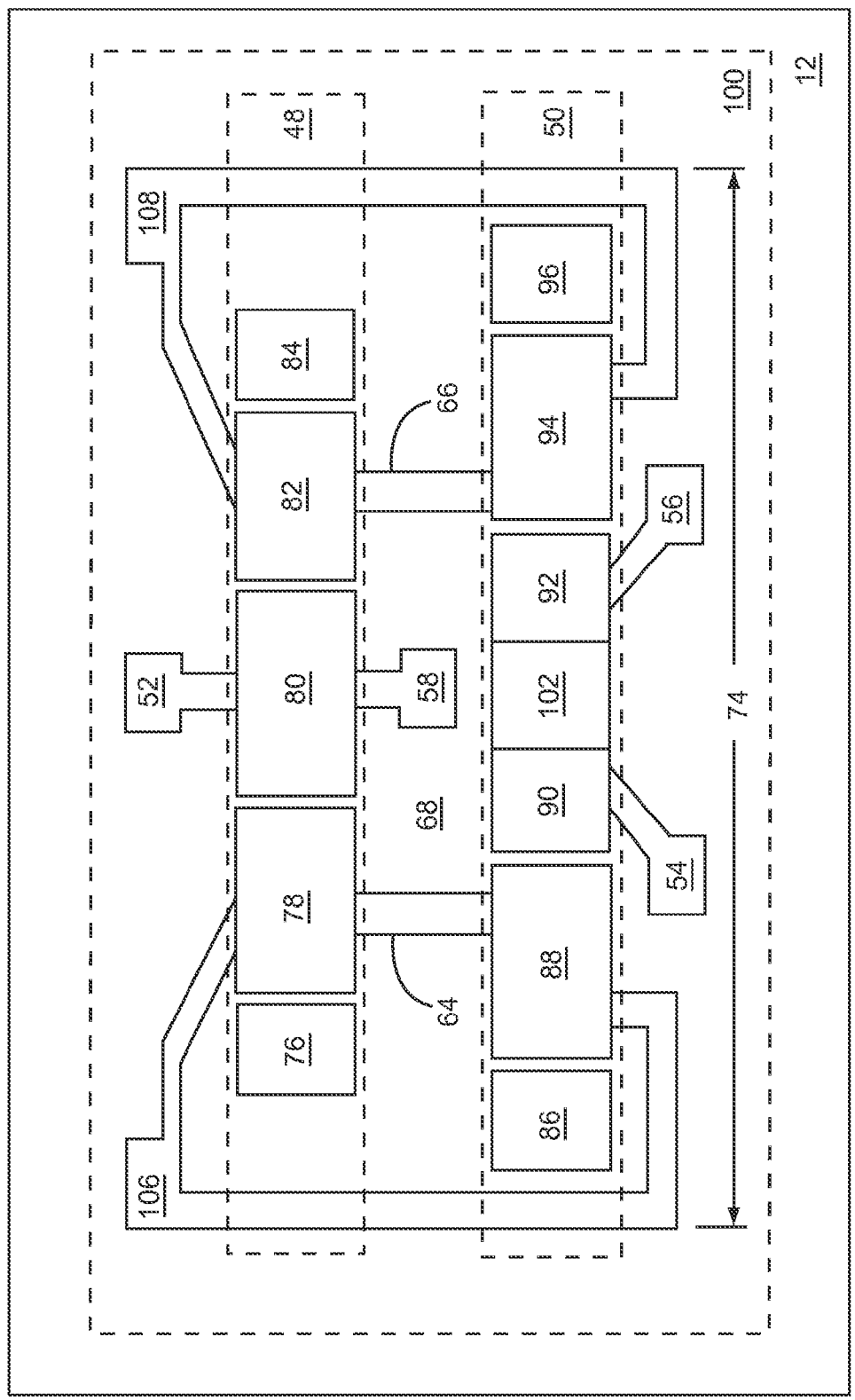
FIG. 12 shows details of the expanded two-track SAW device according to an additional embodiment of the present disclosure.

FIG. 12 shows details of the expanded two-track SAW device 100 according to an additional embodiment of the present disclosure. The expanded two-track SAW device 100 illustrated in FIG. 12 is similar to the expanded two-track SAW device 100 illustrated in FIG. 10, except in the expanded two-track SAW device 100 illustrated in FIG. 12, the third grating 86 and the fourth grating 96 are floating, the grounding IDFs 136 (FIG. 19) of the fourth IDT 88 are not coupled to the third grating 86 but are instead electrically coupled to the first external ground connection node 106, and the grounding IDFs 136 (FIG. 19) of the seventh IDT 94 are not coupled to the fourth grating 96 but are instead electrically coupled to the second external ground connection node 108. As a result, the SAW device width 74 of the expanded two-track SAW device 100 illustrated in FIG. 12 may be larger than the SAW device width 74 of the expanded two-track SAW device 100 illustrated in FIG. 10.

Figure 13:
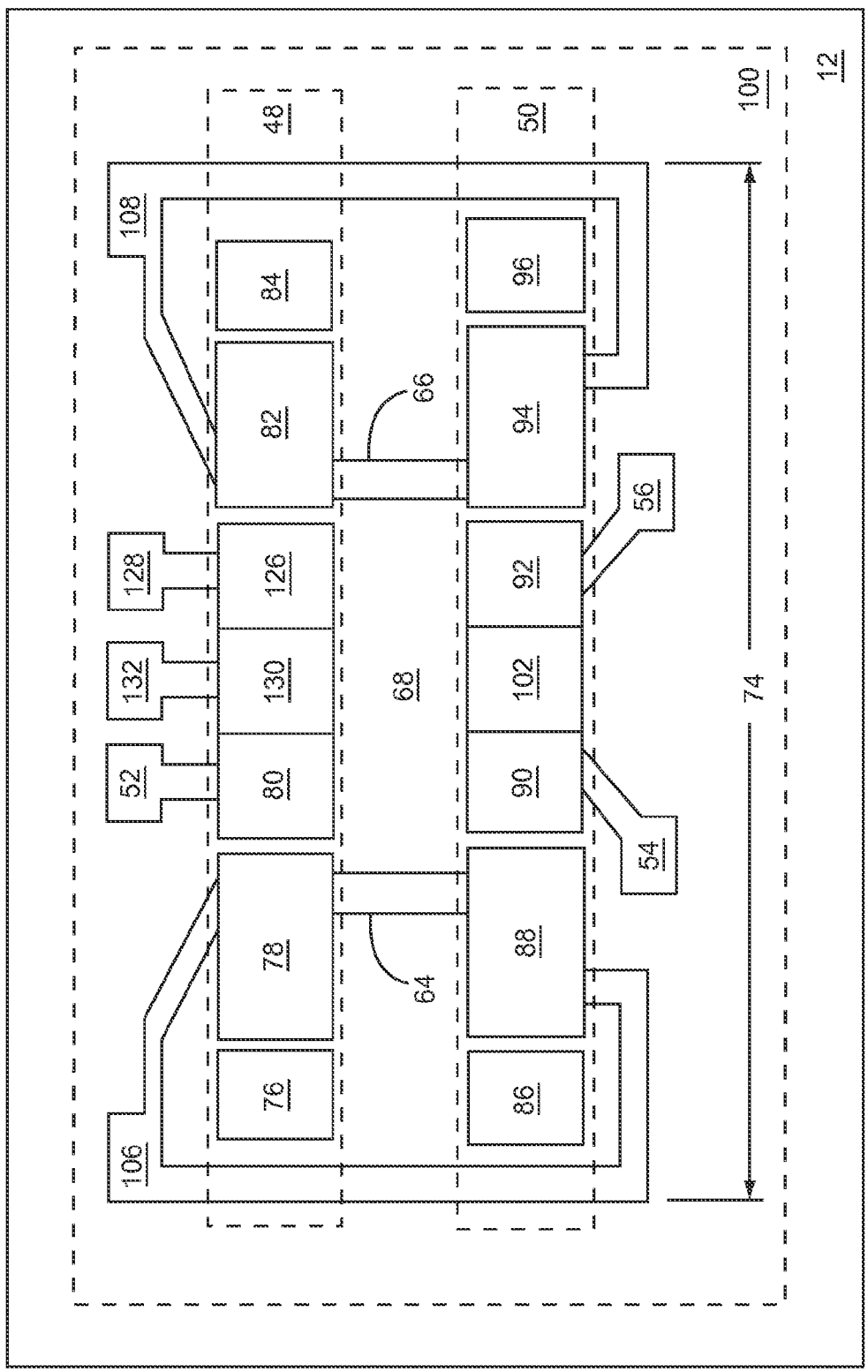
FIG. 13 shows a top-view of the expanded two-track SAW device according to one embodiment of the present disclosure.

FIG. 13 shows a top-view of an expanded two-track SAW device 100 according to one embodiment of the present disclosure. The expanded two-track SAW device 100 illustrated in FIG. 13 is similar to the expanded two-track SAW device 100 illustrated in FIG. 12, except in the expanded two-track SAW device 100 illustrated in FIG. 13, the first SAW track 48 further includes an eighth IDT 126 and the expanded two-track SAW device 100 further includes a fourth connection node 128 disposed on the substrate 12 and electrically coupled to the eighth IDT 126. Additionally, the first SAW track 48 further includes a first interconnecting ground grating 130 and the expanded two-track SAW device 100 further includes a third external ground connection node 132 disposed on the substrate 12, such that the third external ground connection node 132 is electrically coupled to the first interconnecting ground grating 130. The first interconnecting ground grating 130 is adjacent to the second IDT 80 and the eighth IDT 126 is adjacent to the first interconnecting ground grating 130 and the third IDT 82. The grounding IDFs 136 (FIG. 19) of the second IDT 80 are electrically coupled to the first interconnecting ground grating 130 and grounding IDFs 136 (FIG. 19) of the eighth IDT 126 are electrically coupled to the first interconnecting ground grating 130. Active IDFs 134 (FIG. 19) of the eighth IDT 126 are electrically coupled to the fourth connection node 128. The first SAW track 48 illustrated in FIG. 13 is a four-IDT track.

Figure 14:
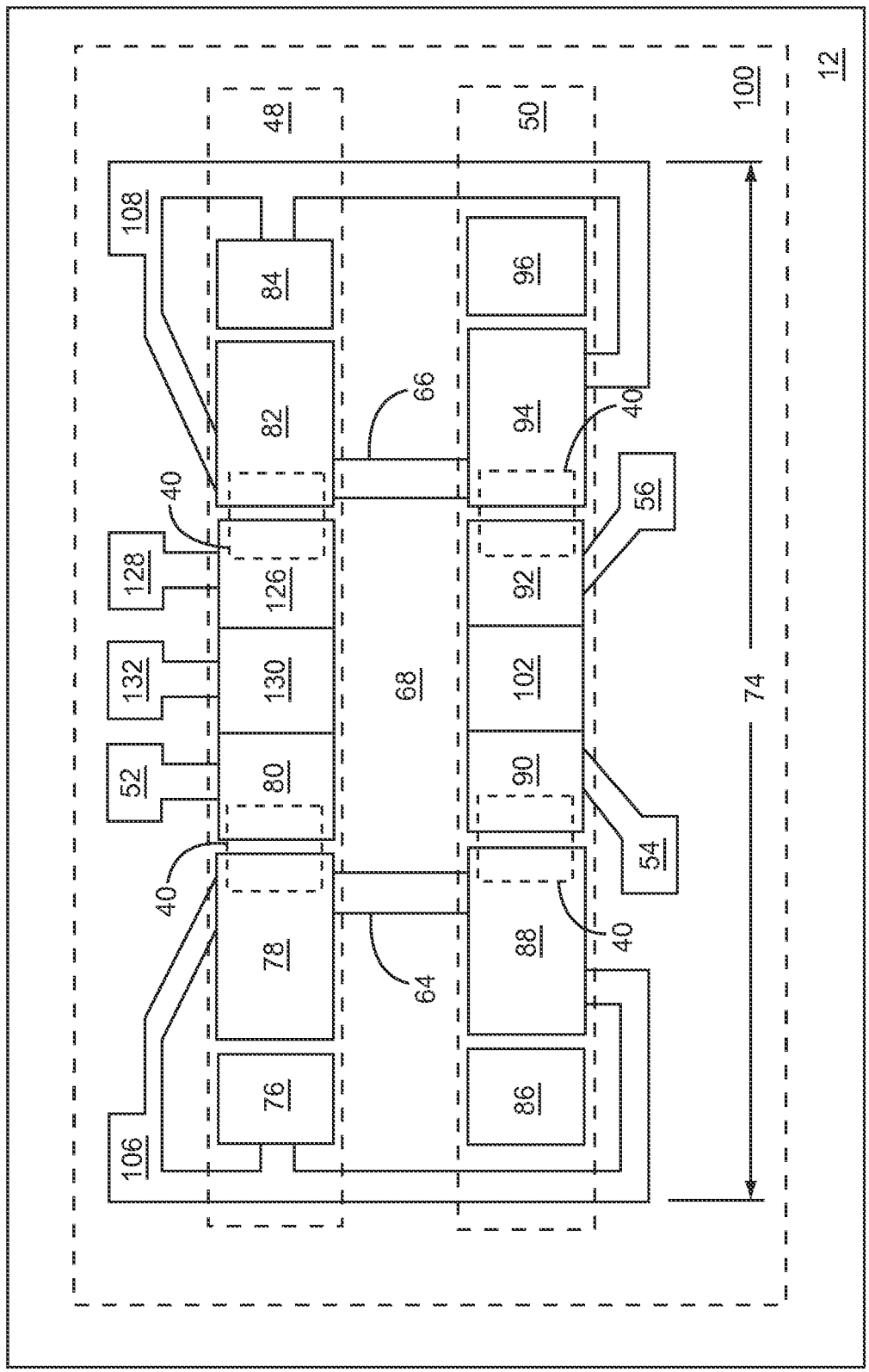
FIG. 14 shows details of the expanded two-track SAW device according to an alternate embodiment of the present disclosure.

FIG. 14 shows details of the expanded two-track SAW device 100 according to an alternate embodiment of the present disclosure. The expanded two-track SAW device 100 illustrated in FIG. 14 is similar to the expanded two-track SAW device 100 illustrated in FIG. 13, except in the expanded two-track SAW device 100 illustrated in FIG. 14, the first grating 76 is electrically coupled to the first external ground connection node 106 and the second grating 84 is electrically coupled to the second external ground connection node 108. The expanded two-track SAW device 100 illustrated in FIG. 14 further includes chirping regions 40 between the first IDT 78 and the second IDT 80, between the eighth IDT 126 and the third IDT 82, between the fourth IDT 88 and the fifth IDT 90, and between the sixth IDT 92 and the seventh IDT 94 to provide appropriate SAW coupling between the first IDT 78 and the second IDT 80, between the eighth IDT 126 and the third IDT 82, between the fourth IDT 88 and the fifth IDT 90, and between the sixth IDT 92 and the seventh IDT 94, respectively.

Figure 15:
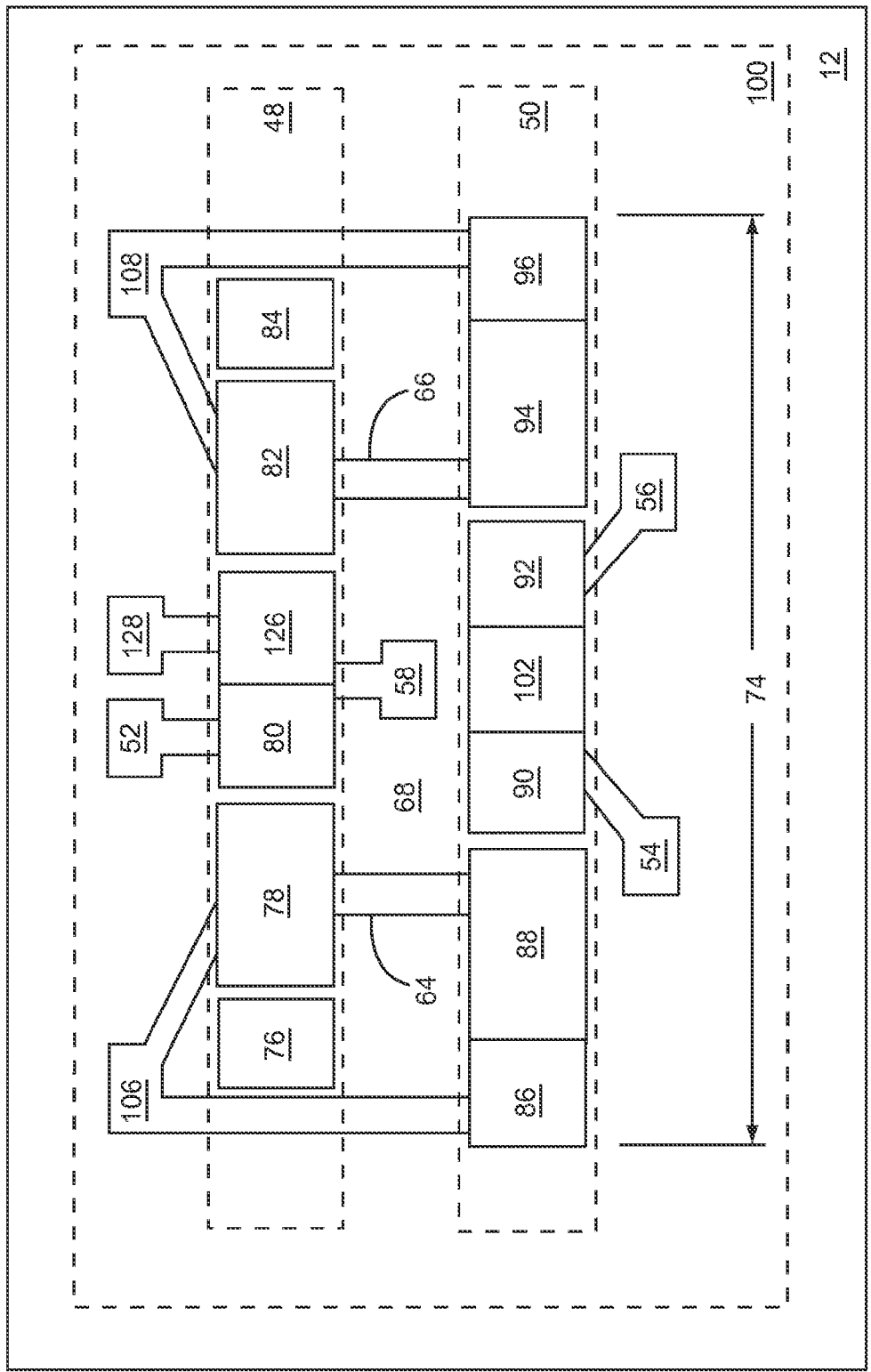
FIG. 15 shows details of the expanded two-track SAW device according to an additional embodiment of the present disclosure.

FIG. 15 shows details of the expanded two-track SAW device 100 according to an additional embodiment of the present disclosure. The expanded two-track SAW device 100 illustrated in FIG. 15 is similar to the expanded two-track SAW device 100 illustrated in FIG. 13, except in the expanded two-track SAW device 100 illustrated in FIG. 15, the third grating 86 is electrically coupled to the first external ground connection node 106, the fourth grating 96 is electrically coupled to the second external ground connection node 108, the grounding IDFs 136 (FIG. 19) of the fourth IDT 88 are electrically coupled to the third grating 86, the grounding IDFs 136 (FIG. 19) of the seventh IDT 94 are electrically coupled to the fourth grating 96, the first interconnecting ground grating 130 is omitted, and the third external ground connection node 132 is omitted. The grounding IDFs 136 (FIG. 19) of the second IDT 80 and the eighth IDT 126 are electrically coupled to one another and to the internal ground connection node 58.

Figure 16:
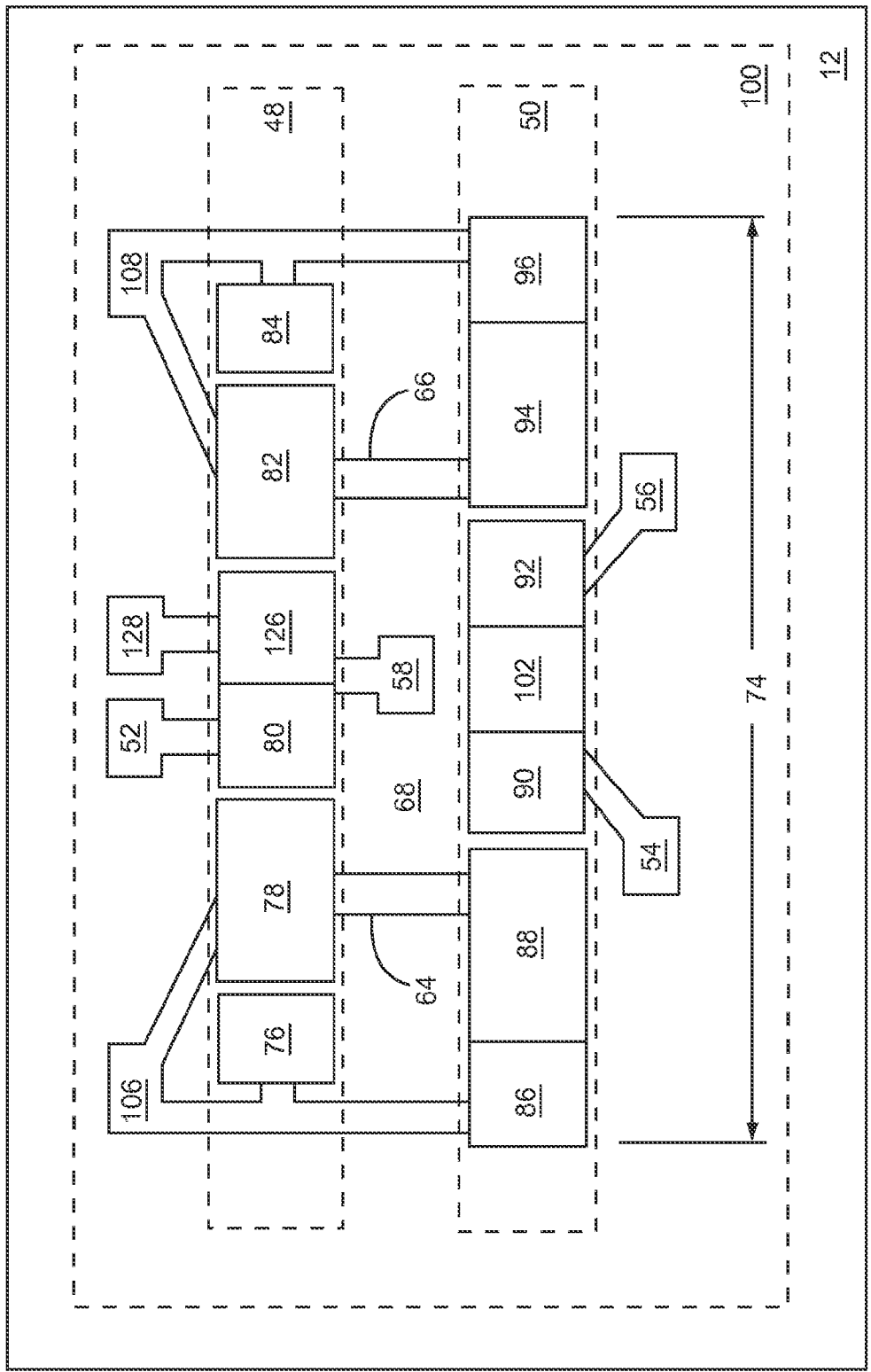
FIG. 16 shows details of the expanded two-track SAW device according to another embodiment of the present disclosure.

FIG. 16 shows details of the expanded two-track SAW device 100 according to another embodiment of the present disclosure. The expanded two-track SAW device 100 illustrated in FIG. 16 is similar to the expanded two-track SAW device 100 illustrated in FIG. 15, except in the expanded two-track SAW device 100 illustrated in FIG. 16, the first grating 76 is electrically coupled to the first external ground connection node 106 and the second grating 84 is electrically coupled to the second external ground connection node 108.

Figure 17:
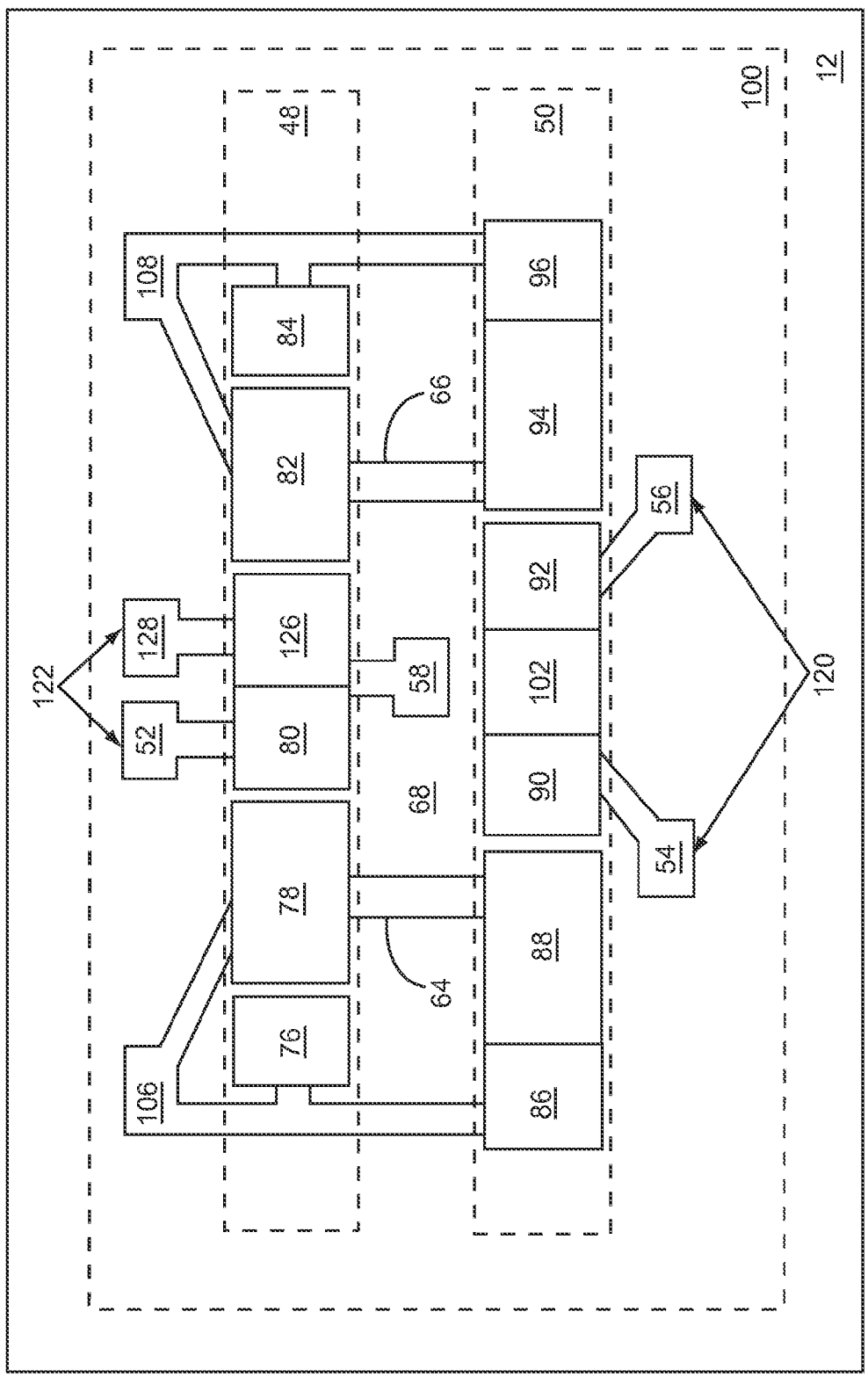
FIG. 17 shows details of the expanded two-track SAW device illustrated in FIG. 16 according to one embodiment of the expanded two-track SAW device.

FIG. 17 shows details of the expanded two-track SAW device 100 illustrated in FIG. 16 according to one embodiment of the expanded two-track SAW device 100. The expanded two-track SAW device 100 illustrated in FIG. 17 is similar to the expanded two-track SAW device 100 illustrated in FIG. 16, except in the expanded two-track SAW device 100 illustrated in FIG. 17, the first connection node 52 and the fourth connection node 128 provide a differential input 122 to the expanded two-track SAW device 100, and the second and the third connection nodes 54, 56 provide a differential output 120 from the expanded two-track SAW device 100.

When a differential AC input signal is applied between the first and the fourth connection nodes 52, 128, the second and the eighth IDTs 80, 126, respectively, may convert the differential AC input signal into surface acoustic waves in the first SAW track 48. The first and the third IDTs 78, 82 may convert the surface acoustic waves in the first SAW track 48 into a first AC signal on the first re-radiation interconnection 64 and a second AC signal on the second re-radiation interconnection 66, respectively. The fourth and the seventh IDTs 88, 94 may convert the first and the second AC signals, respectively, into surface acoustic waves in the second SAW track 50. The fifth and the sixth IDTs 90, 92 may convert the surface acoustic waves in the second SAW track 50 into a differential AC output signal on the second and the third connection nodes 54, 56, respectively.

Figure 18:
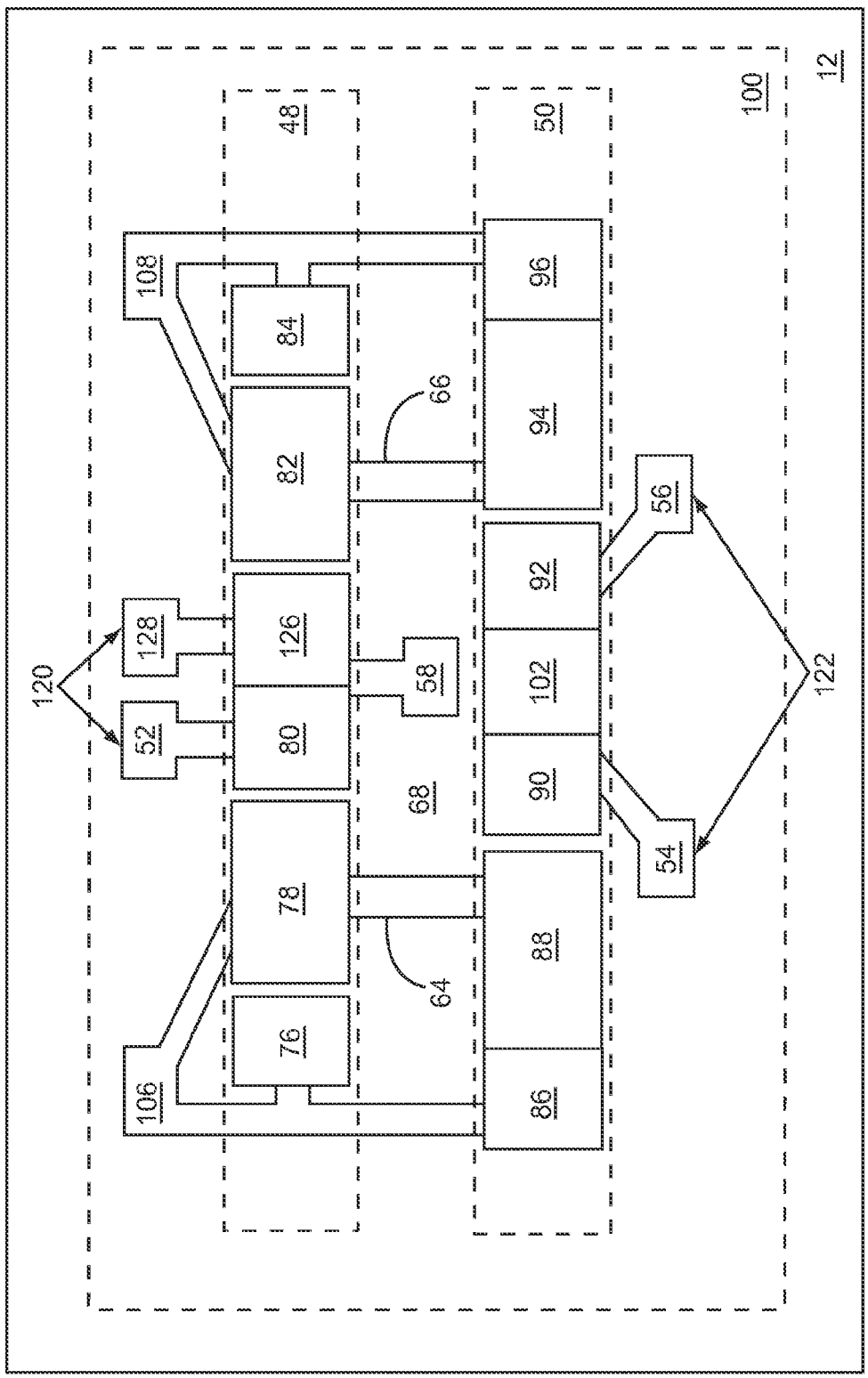
FIG. 18 shows details of the expanded two-track SAW device illustrated in FIG. 16 according to an alternate embodiment of the expanded two-track SAW device.

FIG. 18 shows details of the expanded two-track SAW device 100 illustrated in FIG. 16 according to an alternate embodiment of the expanded two-track SAW device 100. The expanded two-track SAW device 100 illustrated in FIG. 18 is similar to the expanded two-track SAW device 100 illustrated in FIG. 16, except in the expanded two-track SAW device 100 illustrated in FIG. 18, the second and the third connection nodes 54, 56 provide the differential input 122 to the expanded two-track SAW device 100, and the first and the fourth connection nodes 52, 128 provide the differential output 120 from the expanded two-track SAW device 100.

When a differential AC input signal is applied between second and the third connection nodes 54, 56, the fifth and the sixth IDTs 90, 92, respectively, may convert the differential AC input signal into surface acoustic waves in the second SAW track 50. The fourth and the seventh IDTs 88, 94 may convert the surface acoustic waves in the second SAW track 50 into first and second AC signals on the first and the second re-radiation interconnections 64, 66, respectively. The first and the third IDTs 78, 82 may convert the first and the second AC signals, respectively, into surface acoustic waves in the first SAW track 48. The second and the eighth IDTs 80, 126 may convert the surface acoustic waves in the first SAW track 48 into a differential AC output signal between the first and the fourth connection nodes 52, 128.

Figure 19:
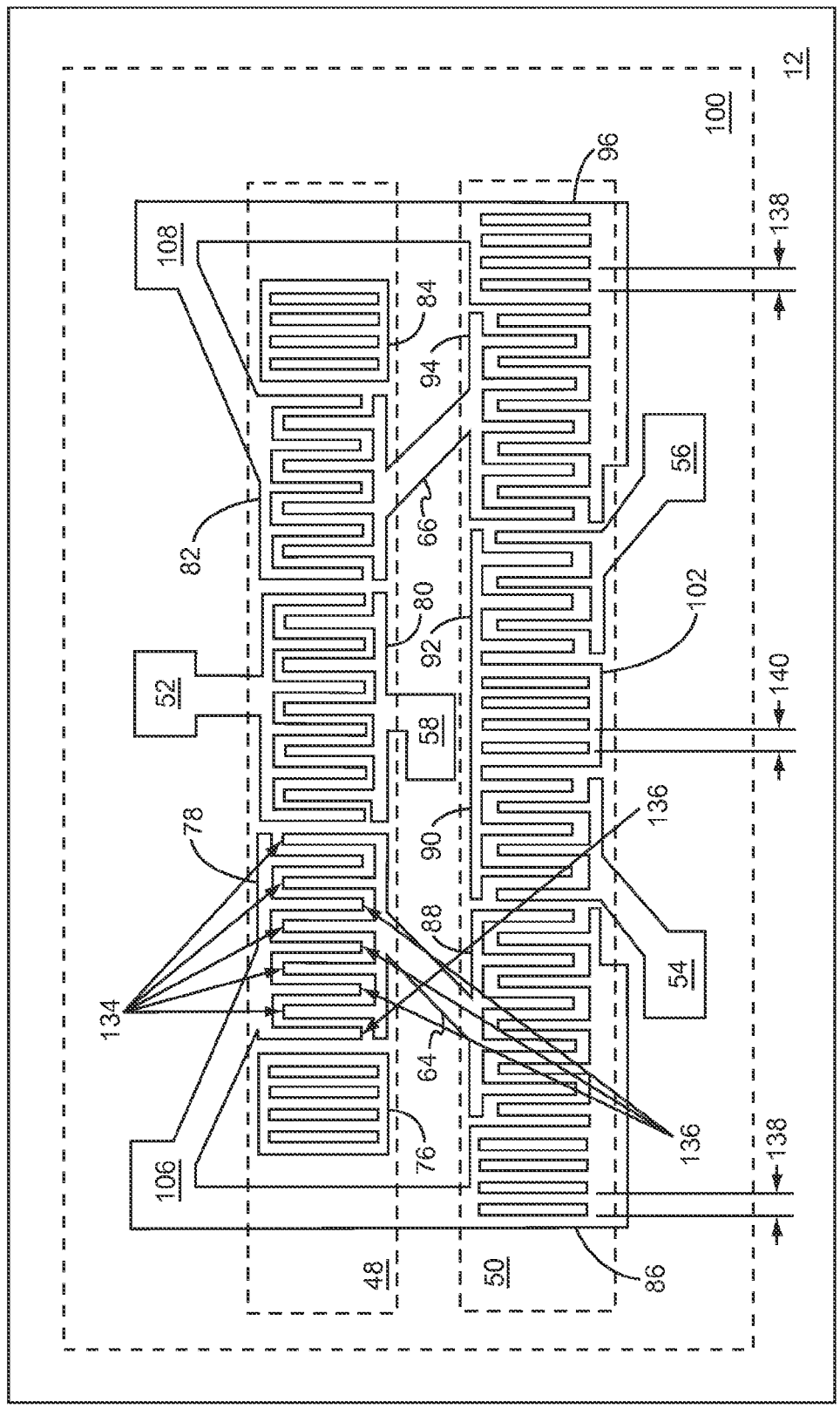
FIG. 19 shows details of the expanded two-track SAW device illustrated in FIG. 10 according to another embodiment of the expanded two-track SAW device.

FIG. 19 shows details of the expanded two-track SAW device 100 illustrated in FIG. 10 according to another embodiment of the expanded two-track SAW device 100. The expanded two-track SAW device 100 illustrated in FIG. 19 shows the active IDFs 134 and the grounding IDFs 136 of the first IDT 78, the second IDT 80, the third IDT 82, the fourth IDT 88, the fifth IDT 90, the sixth IDT 92, and the seventh IDT 94. Each of the third grating 86 and the fourth grating 96 may have an edge grating periodicity 138. The interconnecting grating 102 has an interconnecting grating periodicity 140. The interconnecting grating periodicity 140 may be less than the edge grating periodicity 138. In this regard, when the expanded two-track SAW device 100 is used as a bandpass filter, insertion loss, roll-off response characteristics, or both of the bandpass filter may be improved. In an exemplary embodiment of the expanded two-track SAW device 100, the interconnecting grating periodicity 140 is between about 98 percent and about 100 percent of the edge grating periodicity 138.

Figure 20:
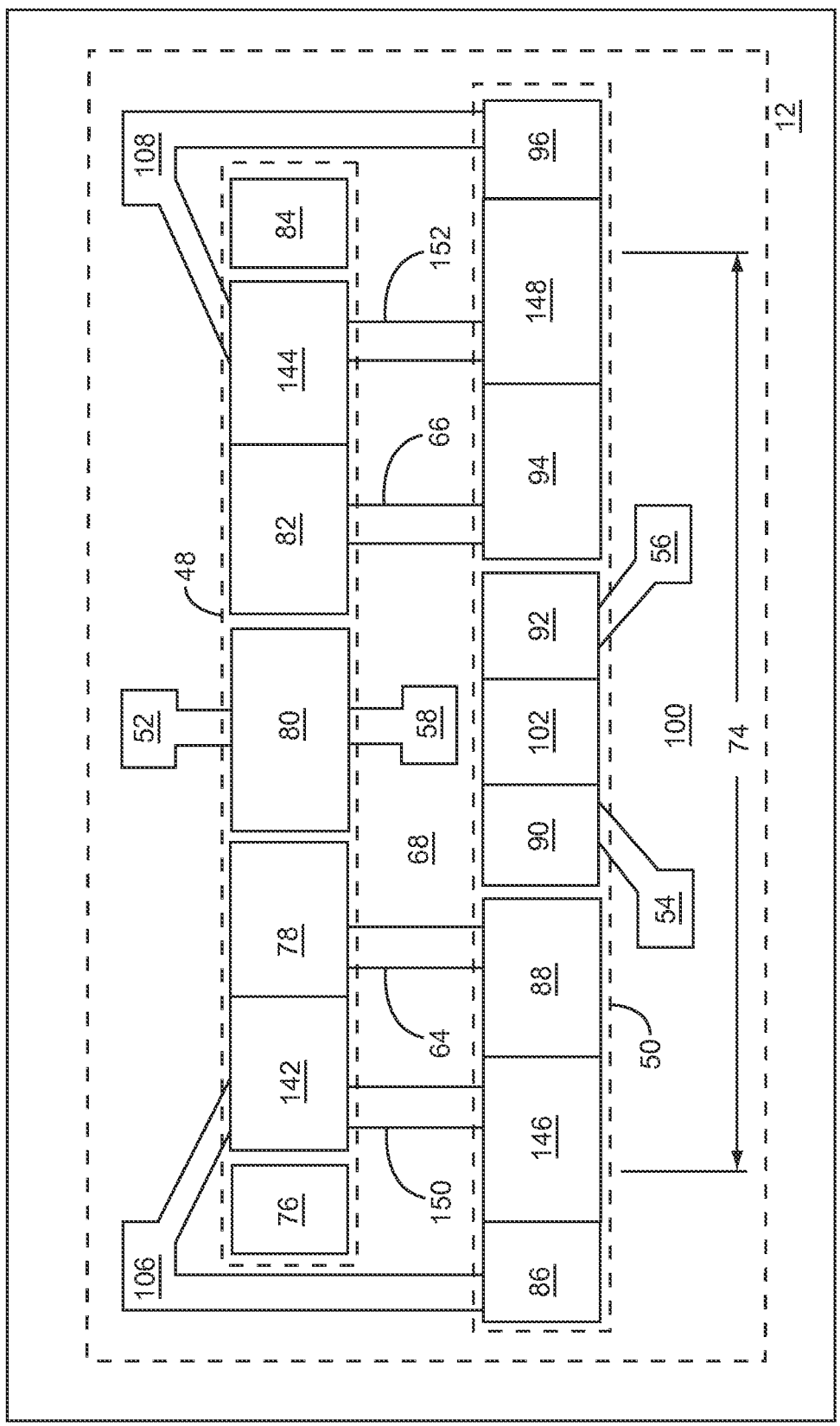
FIG. 20 shows a top-view of the expanded two-track SAW device according to a supplemental embodiment of the present disclosure.

FIG. 20 shows a top-view of an expanded two-track SAW device 100 according to a supplemental embodiment of the present disclosure. In the expanded two-track SAW device 100 illustrated in FIG. 20, the first SAW track 48 includes the first IDT 78, the second IDT 80, the third IDT 82, a ninth IDT 142, and a tenth IDT 144. As such, the first SAW track 48 is a five-IDT track and may function as a multi-mode SAW track. The second SAW track 50 includes the fourth IDT 88, the fifth IDT 90, the sixth IDT 92, the seventh IDT 94, an eleventh IDT 146, a twelfth IDT 148, and the interconnecting grating 102. As such, the second SAW track 50 is a six-IDT track and may function as a multi-mode SAW track. The expanded two-track SAW device 100 includes a third electrical interconnection 150 disposed on the substrate 12 and electrically coupling the ninth IDT 142 to the eleventh IDT 146. The expanded two-track SAW device 100 further includes a fourth electrical interconnection 152 disposed on the substrate 12 and electrically coupling the tenth IDT 144 to the twelfth IDT 148. The fourth IDT 88, the fifth IDT 90, and the eleventh IDT 146 are on one side of the interconnecting grating 102 and the sixth IDT 92, the seventh IDT 94, and the twelfth IDT 148 are on the other side of the interconnecting grating 102. In general, the second SAW track 50 typically has an even number of IDTs, which may be divided into two groups of equal quantity. The interconnecting grating 102 is located between the two groups of IDTs. In another embodiment of the expanded two-track SAW device 100, the first SAW track 48 has at least five IDTs and the second SAW track 50 has any number of IDTs. In a further embodiment of the expanded two-track SAW device 100, the second SAW track 50 has at least six IDTs and the first SAW track 48 has any number of IDTs.

Figure 21:
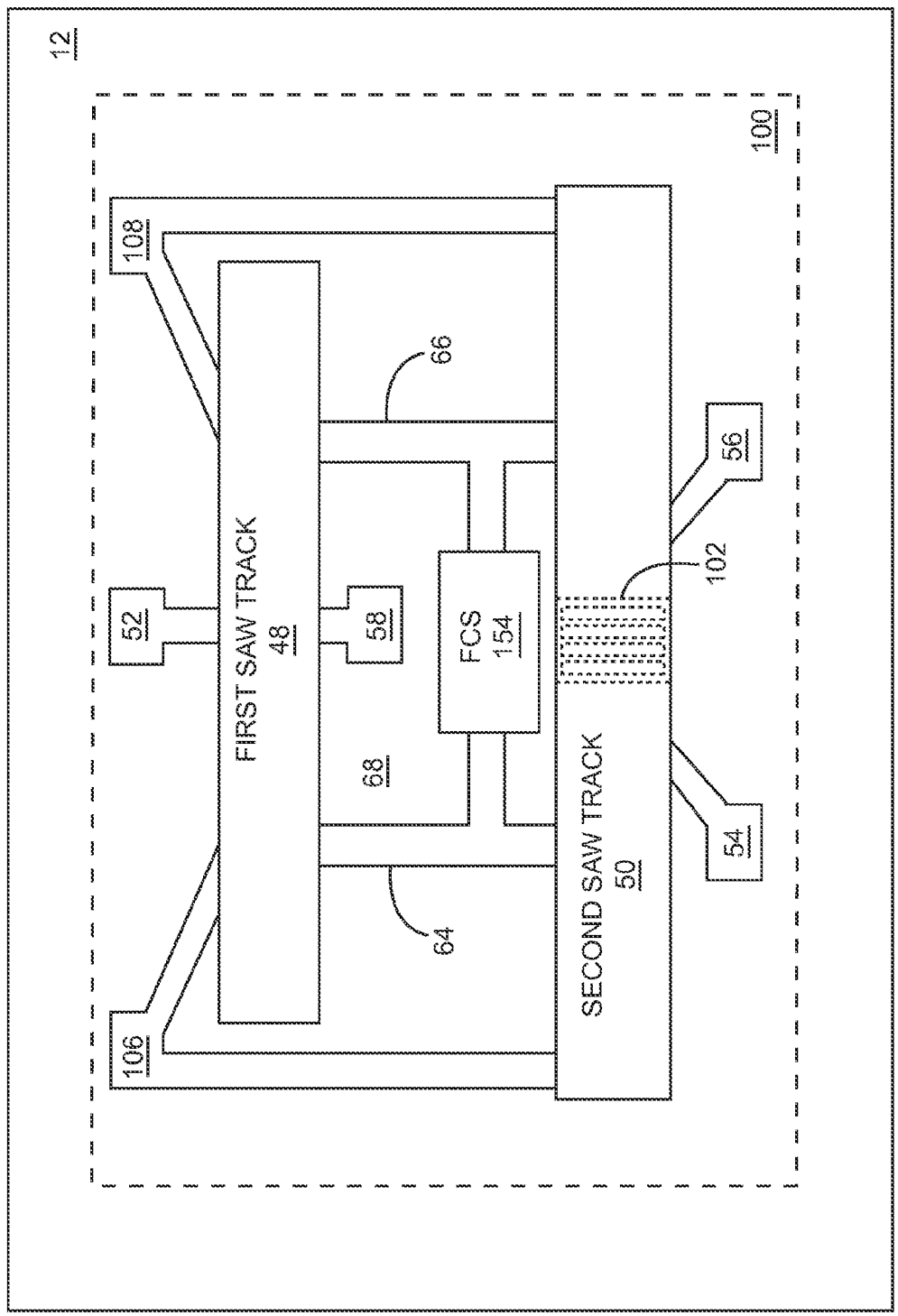
FIG. 21 shows a top-view of the expanded two-track SAW device according to one embodiment of the expanded two-track SAW device.

FIG. 21 shows a top-view of the expanded two-track SAW device 100 according to one embodiment of the expanded two-track SAW device 100. The expanded two-track SAW device 100 illustrated in FIG. 21 is similar to the expanded two-track SAW device 100 illustrated in FIG. 6, except the expanded two-track SAW device 100 illustrated in FIG. 21 further includes a first capacitance structure 154. One characteristic of SAW devices is that static capacitance of an IDT may be approximately a linear function of a length of the IDT, and dynamic inductance of a SAW device may be approximately a quadratic function of the length of the IDT. As a result, relatively short IDTs may tend to have predominantly capacitive admittances and SAW devices having relatively long IDTs may tend to have inductive admittances. The re-radiating passes in the expanded two-track SAW device 100 may be relatively long when passbands of bandpass filters using the expanded two-track SAW device 100 are relatively narrow. As a result, the re-radiating passes between the first SAW track 48 and the second SAW track 50 may inductively load one another. In general, to improve matching conditions between the SAW tracks 48, 50, compensation capacitance may be added between the first re-radiation interconnection 64 and the second re-radiation interconnection 66. By improving matching conditions, Insertion loss and return loss of bandpass filters that use the expanded two-track SAW device 100 may be improved.

The expanded two-track SAW device 100 includes the first capacitance structure 154 disposed over the substrate 12. The first capacitance structure 154 has a first capacitance and is electrically coupled between the first re-radiation interconnection 64 and the second re-radiation interconnection 66. In this regard, the first capacitance may provide the compensation capacitance between the first re-radiation interconnection 64 and the second re-radiation interconnection 66. In one embodiment of the expanded two-track SAW device 100, the first capacitance structure 154 is disposed on the substrate 12.

Figure 22:
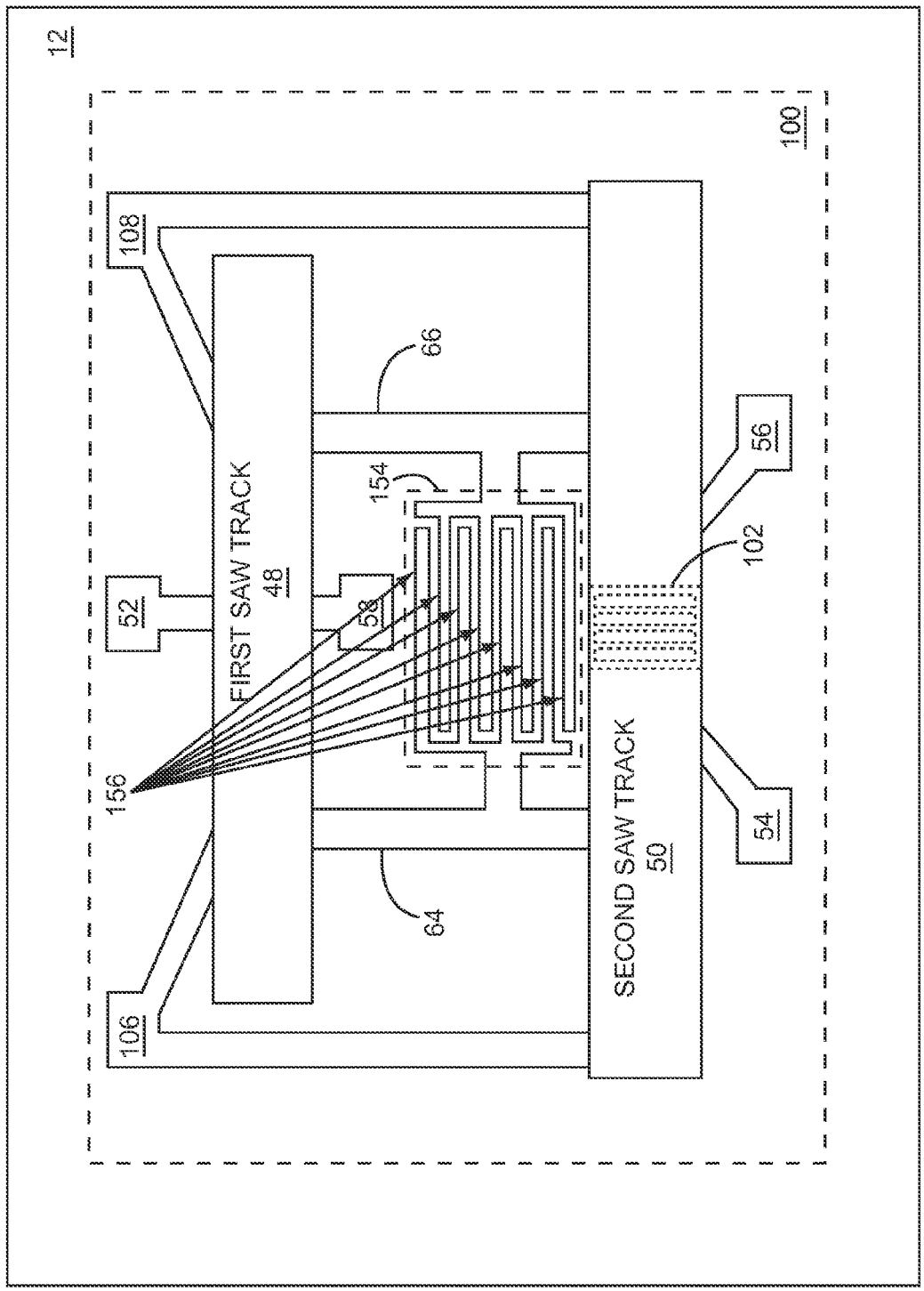
FIG. 22 shows details of the first capacitance structure illustrated in FIG. 21 according to one embodiment of the first capacitance structure.

FIG. 22 shows details of the first capacitance structure 154 illustrated in FIG. 21 according to one embodiment of the first capacitance structure 154. The first capacitance structure 154 includes a first group of fingers 156 and a second group of fingers 156 interleaved with one another to provide the first capacitance, such that the first group of fingers 156 is electrically coupled to the first re-radiation interconnection 64 and the second group of fingers 156 is electrically coupled to the second re-radiation interconnection 66. The fingers 156 may be of any shape, including straight, as shown, or curved in any manner. Multiple interleaved fingers 156 may provide adequate capacitance between the fingers, while keeping the size of the expanded two-track SAW device 100 relatively small.

Figure 23:
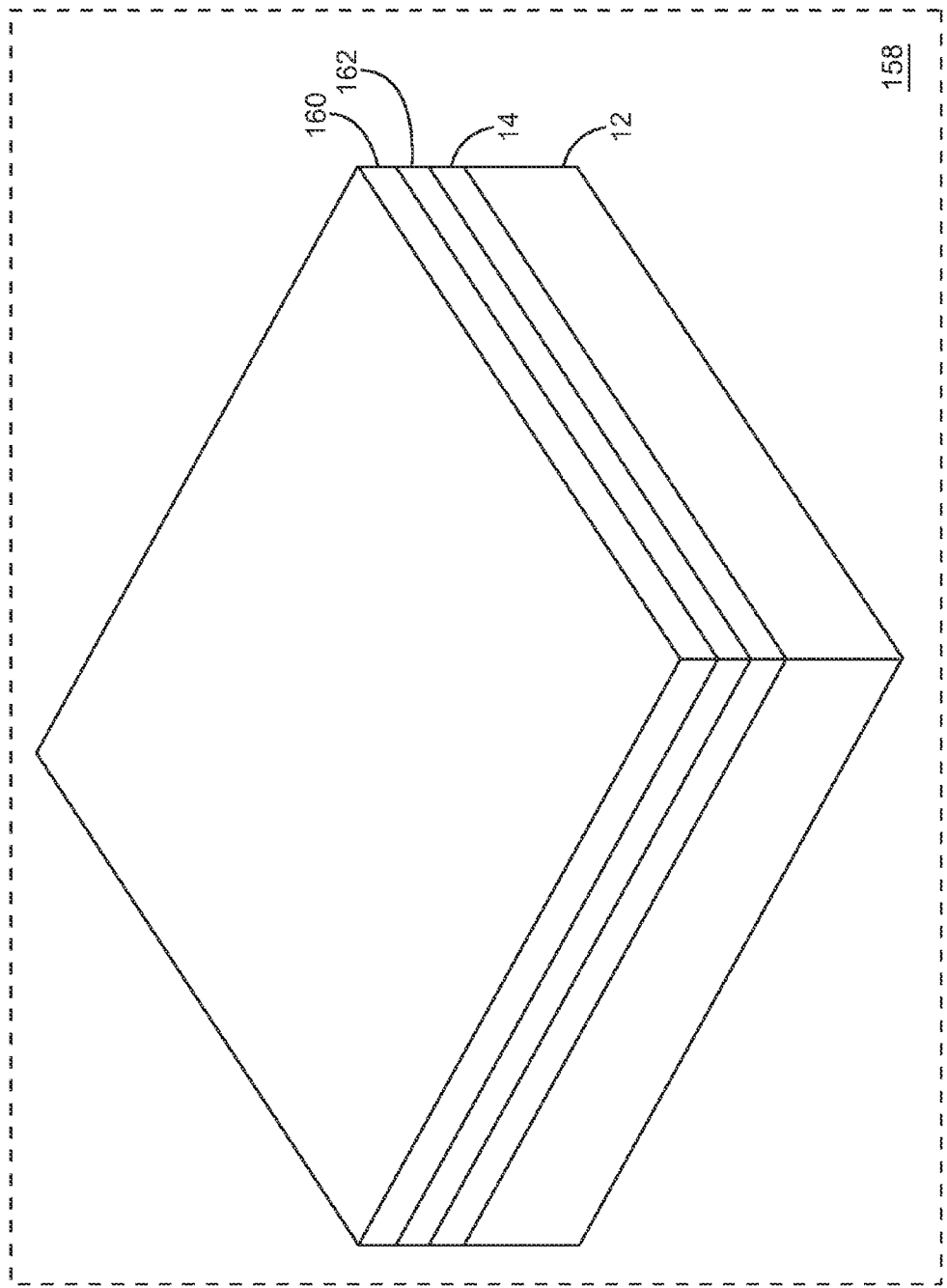
FIG. 23 shows an isometric view of a multi-layer piezoelectric wafer that may be suitable for fabricating the expanded two-track SAW device according to one embodiment of the expanded two-track SAW device.

FIG. 23 shows an isometric view of a multi-layer piezoelectric wafer 158 that may be suitable for fabricating the expanded two-track SAW device 100 according to one embodiment of the expanded two-track SAW device 100. The multi-layer piezoelectric wafer 158 includes the substrate 12, the first conductive layer 14, a second conductive layer 160, and an insulating layer 162. The substrate 12 provides material upon which the expanded two-track SAW device 100 may be formed. The first conductive layer 14 is over the substrate 12 and is patterned to provide electrical connections and conductive elements of the expanded two-track SAW device 100. The insulating layer 162 is over the first conductive layer 14 and the second conductive layer 160 is over the insulating layer 162. The insulating layer 162 may electrically isolate the first conductive layer 14 from the second conductive layer 160. The second conductive layer 160 may enable crossover of certain structures of the expanded two-track SAW device 100 that are formed using the first conductive layer 14.

Figure 24:
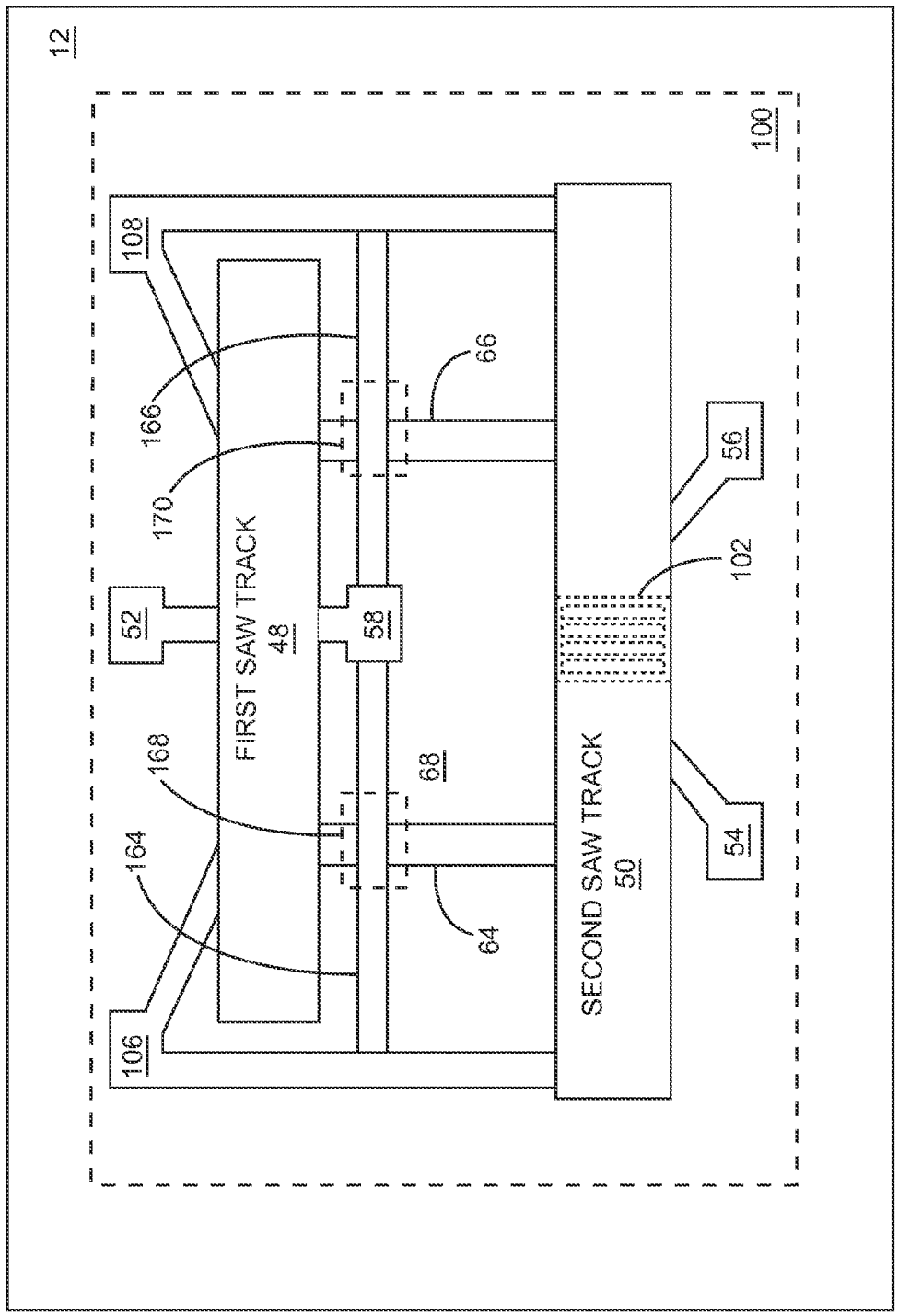
FIG. 24 shows a top-view of the expanded two-track SAW device according to an alternate embodiment of the expanded two-track SAW device.

FIG. 24 shows a top-view of the expanded two-track SAW device 100 according to an alternate embodiment of the expanded two-track SAW device 100. The expanded two-track SAW device 100 illustrated in FIG. 24 is similar to the expanded two-track SAW device 100 illustrated in FIG. 6, except the expanded two-track SAW device 100 illustrated in FIG. 24 further includes a first ground crossover interconnection 164 and a second ground crossover interconnection 166. The first ground crossover interconnection 164 is electrically coupled between the first external ground connection node 106 and the internal ground connection node 58, such that the first ground crossover interconnection 164 and the first re-radiation interconnection 64 have a first overlap region 168, which has a first overlap capacitance between the first ground crossover interconnection 164 and the first re-radiation interconnection 64.

The second ground crossover interconnection 166 is electrically coupled between the second external ground connection node 108 and the internal ground connection node 58, such that the second ground crossover interconnection 166 and the second re-radiation interconnection 66 have a second overlap region 170, which has a second overlap capacitance between the second ground crossover interconnection 166 and the second re-radiation interconnection 66. In general, the first ground crossover interconnection 164 is electrically coupled between ground and the internal ground connection node 58, and the second ground crossover interconnection 166 is electrically coupled between ground and the internal ground connection node 58. In one embodiment of the expanded two-track SAW device 100, the first re-radiation interconnection 64 and the second re-radiation interconnection 66 are formed from the first conductive layer 14 and the first ground crossover interconnection 164 and the second ground crossover interconnection 166 are formed from the second conductive layer 160. In an alternate embodiment of the expanded two-track SAW device 100, the first re-radiation interconnection 64 and the second re-radiation interconnection 66 are formed from the second conductive layer 160 and the first ground crossover interconnection 164 and the second ground crossover interconnection 166 are formed from the first conductive layer 14. In other embodiments of the expanded two-track SAW device 100, either of the first ground crossover interconnection 164 and the second ground crossover interconnection 166 may be omitted. Therefore, series combination of the first overlap capacitance and the second overlap capacitance may provide the compensation capacitance between the first re-radiation interconnection and the second re-radiation interconnection via ground.

Figure 25:
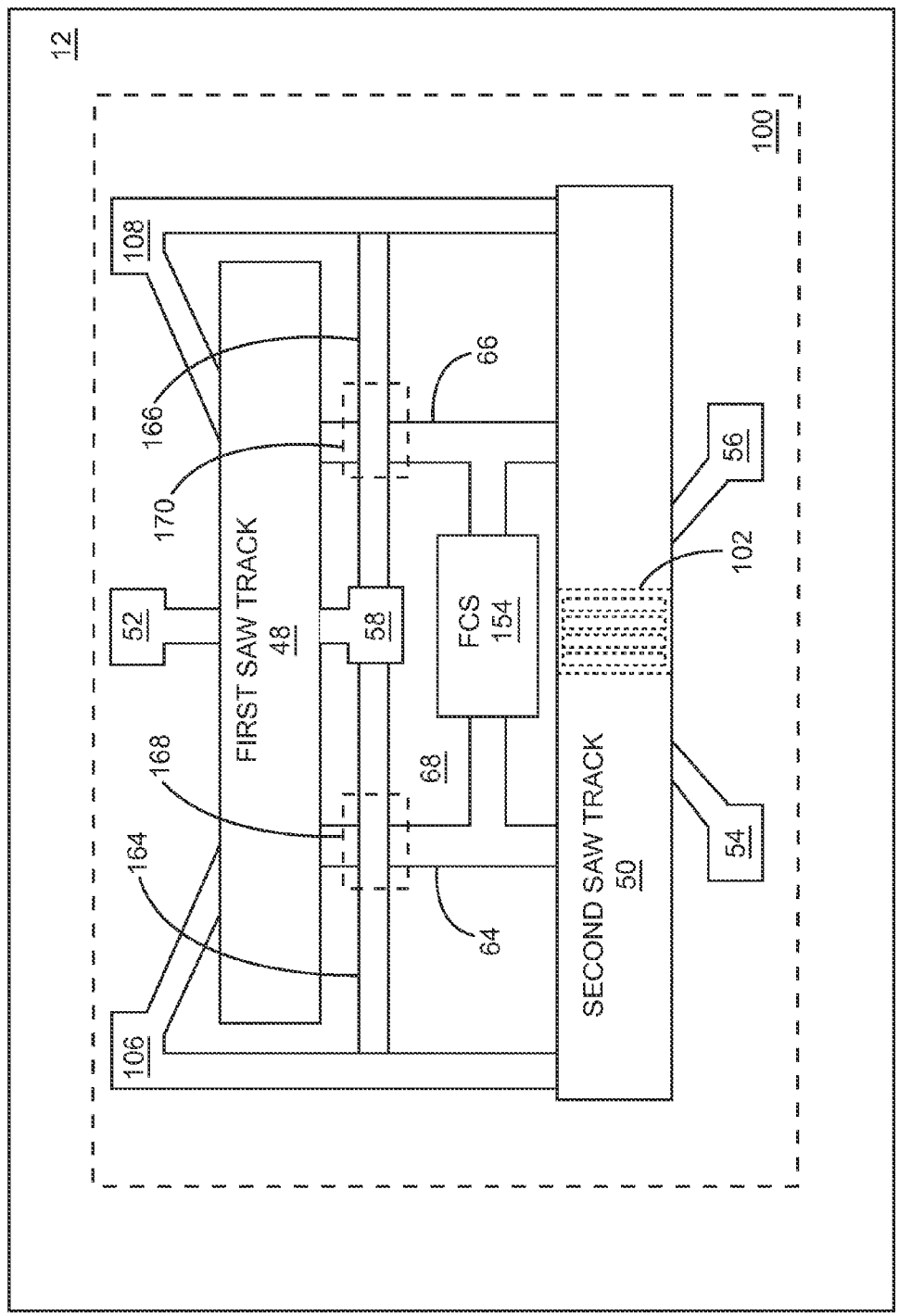
FIG. 25 shows a top-view of the expanded two-track SAW device according to an additional embodiment of the expanded two-track SAW device.

FIG. 25 shows a top-view of the expanded two-track SAW device 100 according to an additional embodiment of the expanded two-track SAW device 100. The expanded two-track SAW device 100 illustrated in FIG. 25 is a combination of the expanded two-track SAW device 100 illustrated in FIG. 21 and the expanded two-track SAW device 100 illustrated in FIG. 24. As a result, the expanded two-track SAW device 100 illustrated in FIG. 25 includes the first capacitance structure 154 electrically coupled between the first re-radiation interconnection 64 and the second re-radiation interconnection 66, the first ground crossover interconnection 164 electrically coupled between ground and the internal ground connection node 58, and the second ground crossover interconnection 166 electrically coupled between ground and the internal ground connection node 58. Therefore, a series combination of the first overlap capacitance and the second overlap capacitance combined in parallel with the first capacitance may provide the compensation capacitance between the first re-radiation interconnection and the second re-radiation interconnection. Since the compensation capacitance includes the first capacitance in parallel with combined first and second overlap capacitances, the first capacitance illustrated in FIG. 25 may be smaller than the first capacitance illustrated in FIG. 21.

Figure 26:
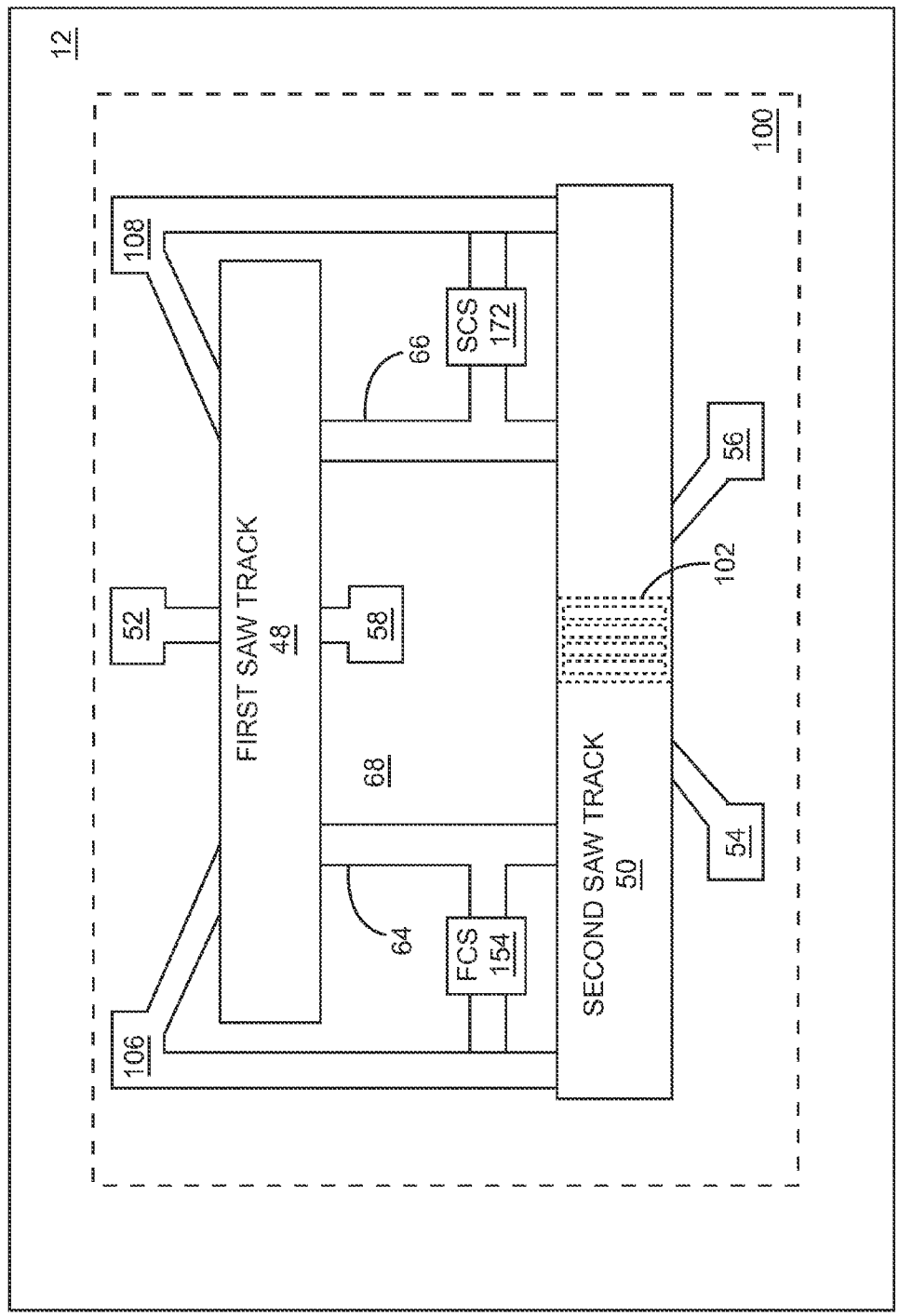
FIG. 26 shows a top-view of the expanded two-track SAW device according to another embodiment of the expanded two-track SAW device.

FIG. 26 shows a top-view of the expanded two-track SAW device 100 according to another embodiment of the expanded two-track SAW device 100. The expanded two-track SAW device 100 illustrated in FIG. 26 is similar to the expanded two-track SAW device 100 illustrated in FIG. 6, except the expanded two-track SAW device 100 illustrated in FIG. 26 further includes the first capacitance structure 154 and a second capacitance structure 172 disposed over the substrate 12. The first capacitance structure 154 has the first capacitance and is electrically coupled between the first re-radiation interconnection 64 and the first external ground connection node 106. The second capacitance structure 172 ground has a second capacitance and is electrically coupled between the second re-radiation interconnection 66 and the second external ground connection node 108. In general, the first capacitance structure 154 is electrically coupled between the first re-radiation interconnection 64 and ground, and the second capacitance structure 172 is electrically coupled between the second re-radiation interconnection 66 and ground. In this regard, a series combination of the first capacitance and the second capacitance may provide the compensation capacitance between the first re-radiation interconnection 64 and the second re-radiation interconnection 66 via ground.

Figure 27:
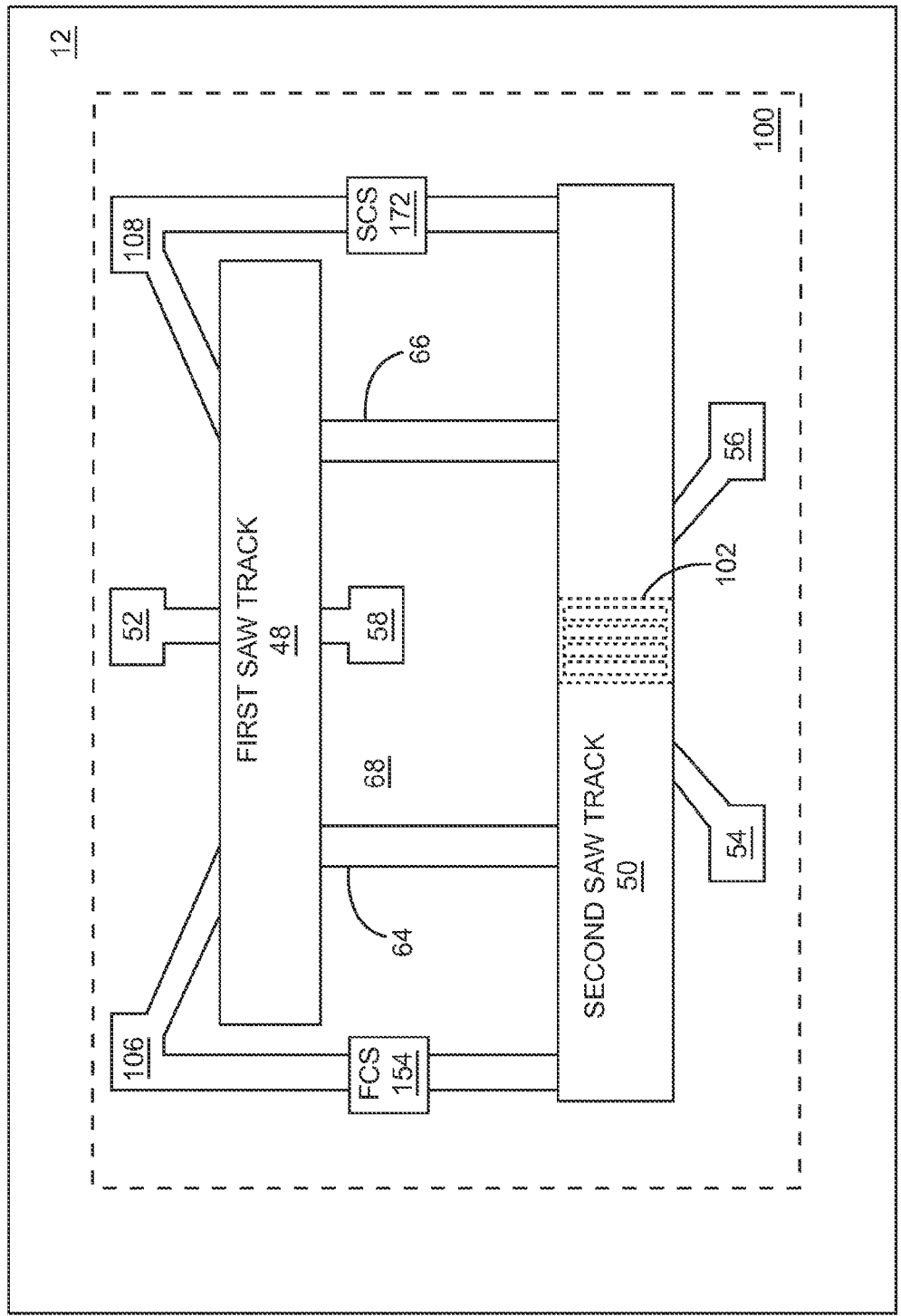
FIG. 27 shows a top-view of the expanded two-track SAW device according to one embodiment of the expanded two-track SAW device.

FIG. 27 shows a top-view of the expanded two-track SAW device 100 according to one embodiment of the expanded two-track SAW device 100. The expanded two-track SAW device 100 illustrated in FIG. 27 is similar to the expanded two-track SAW device 100 illustrated in FIG. 26, except in the expanded two-track SAW device 100 illustrated in FIG. 27 the first capacitance structure 154 is coupled between the first external ground connection node 106 and the second SAW track 50, and the second capacitance structure 172 is coupled between the second external ground connection node 108 and the second SAW track 50.

Figure 28:
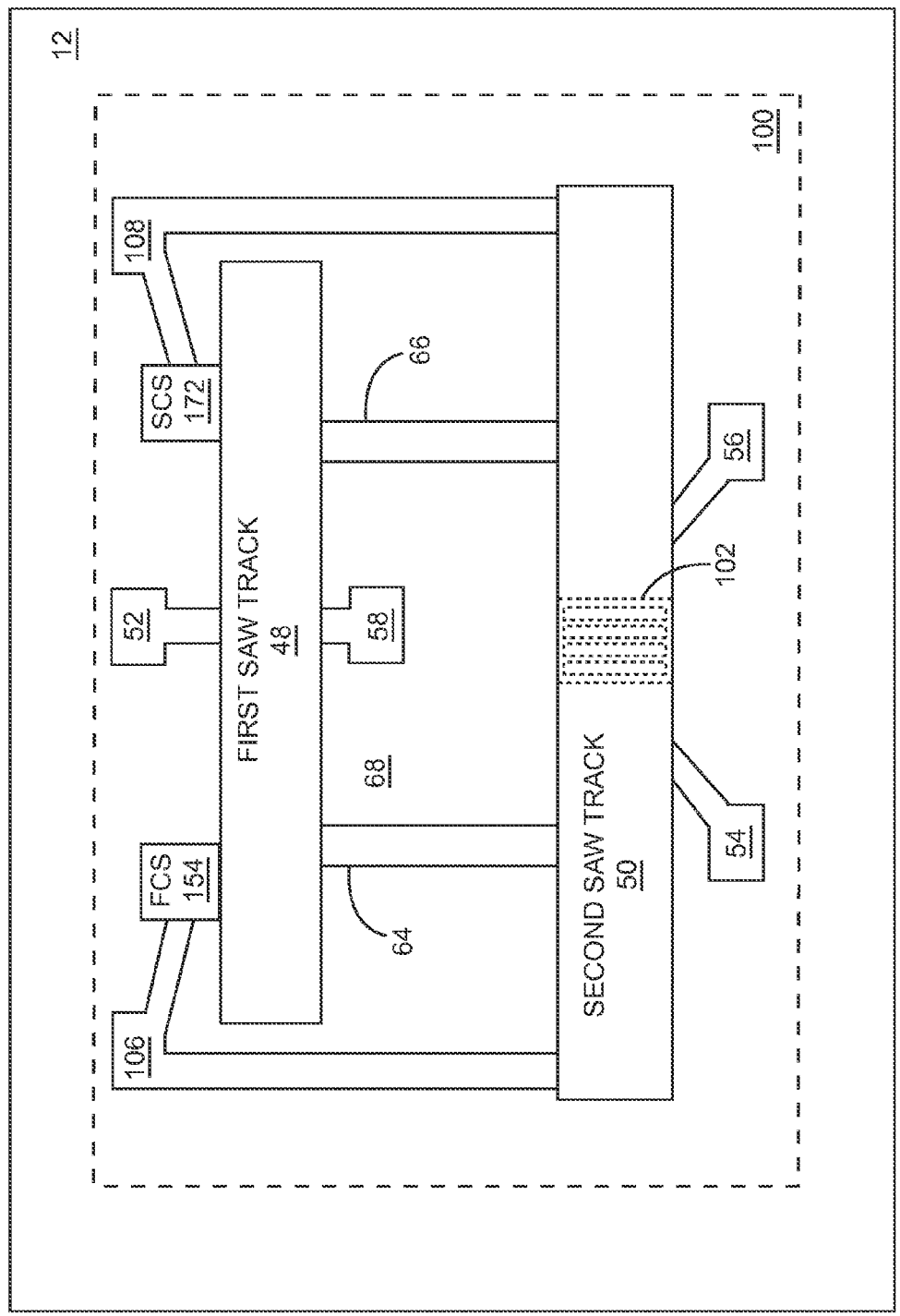
FIG. 28 shows a top-view of the expanded two-track SAW device according to an alternate embodiment of the expanded two-track SAW device.

FIG. 28 shows a top-view of the expanded two-track SAW device 100 according to an alternate embodiment of the expanded two-track SAW device 100. The expanded two-track SAW device 100 illustrated in FIG. 28 is similar to the expanded two-track SAW device 100 illustrated in FIG. 26, except in the expanded two-track SAW device 100 illustrated in FIG. 28 the first capacitance structure 154 is coupled between the first external ground connection node 106 and the first SAW track 48, and the second capacitance structure 172 is coupled between the second external ground connection node 108 and the first SAW track 48.

Figure 29:
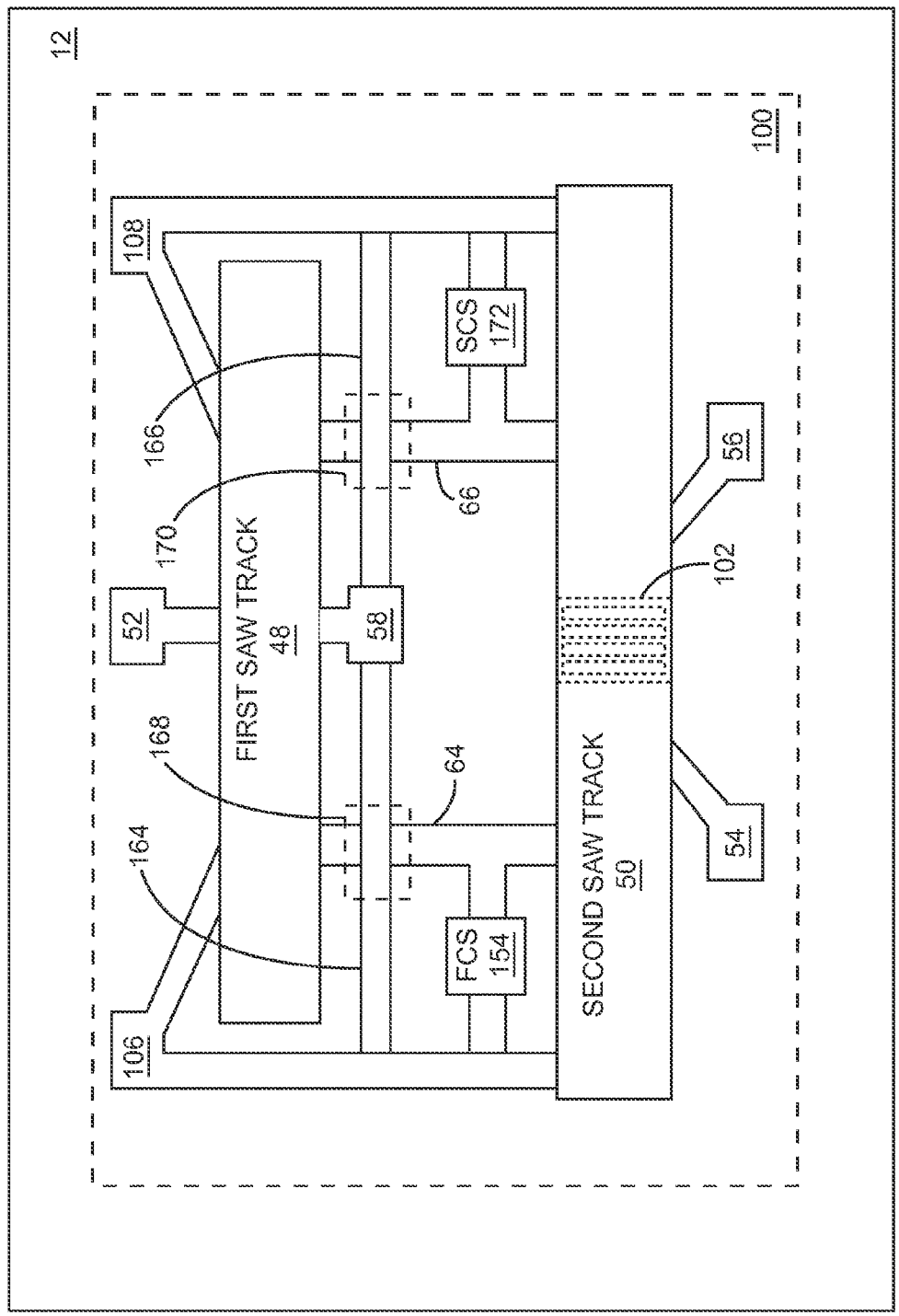
FIG. 29 shows a top-view of the expanded two-track SAW device according to a supplemental embodiment of the expanded two-track SAW device.

FIG. 29 shows a top-view of the expanded two-track SAW device 100 according to a supplemental embodiment of the expanded two-track SAW device 100. The expanded two-track SAW device 100 illustrated in FIG. 29 is a combination of the expanded two-track SAW device 100 illustrated in FIG. 24 and the expanded two-track SAW device 100 illustrated in FIG. 26. As a result, the expanded two-track SAW device 100 illustrated in FIG. 29 includes the first capacitance structure 154 electrically coupled between the first re-radiation interconnection 64 and ground, the second capacitance structure 172 electrically coupled between the second re-radiation interconnection 66 and ground, the first ground crossover interconnection 164 electrically coupled between ground and the internal ground connection node 58, and the second ground crossover interconnection 166 electrically coupled between ground and the internal ground connection node 58. In this regard, a series combination of the first capacitance and the second capacitance combined with a series combination of the first overlay capacitance and the second overlay capacitance may provide the compensation capacitance between the first re-radiation interconnection 64 and the second re-radiation interconnection 66 via ground.

Figure 30:
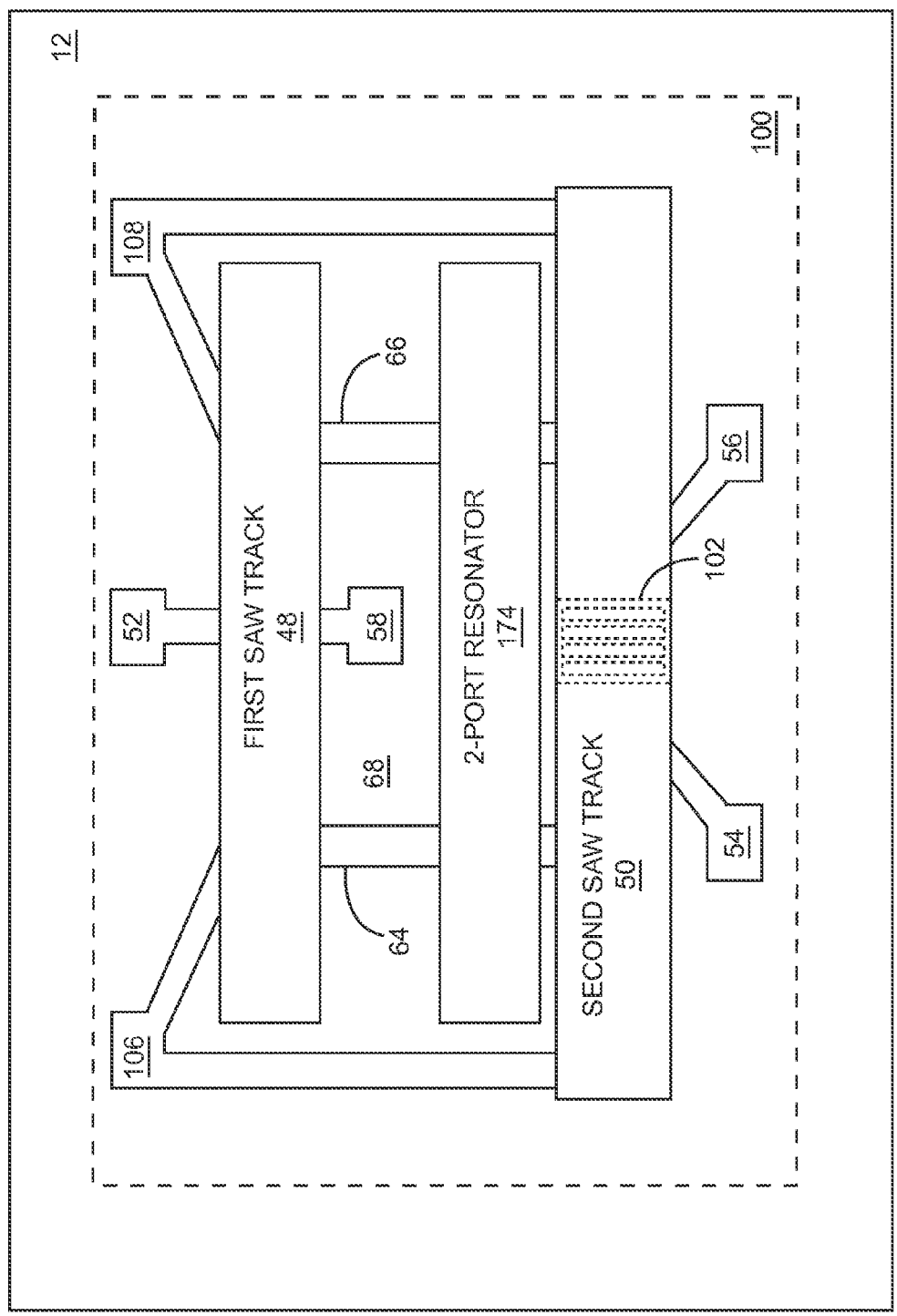
FIG. 30 shows a top-view of the expanded two-track SAW device according to a further embodiment of the expanded two-track SAW device.

FIG. 30 shows a top-view of the expanded two-track SAW device 100 according to a further embodiment of the expanded two-track SAW device 100. The expanded two-track SAW device 100 illustrated in FIG. 30 is similar to the expanded two-track SAW device 100 illustrated in FIG. 6, except in the expanded two-track SAW device 100 illustrated in FIG. 30, the expanded two-track SAW device 100 further includes a 2-port resonator 174 disposed on the substrate and coupled between the first SAW track 48 and the second SAW track 50 via the first re-radiation interconnection 64 and the second re-radiation interconnection 66. The 2-port resonator 174 may provide the compensation capacitance between the first re-radiation interconnection 64 and the second re-radiation interconnection 66, while providing adequate re-radiation pass connectivity between the first SAW track 48 and the second SAW track 50. One disadvantage of using the 2-port resonator 174 in the expanded two-track SAW device 100 is that the size of the 2-port resonator 174 may be too large for certain applications.

Figure 31:
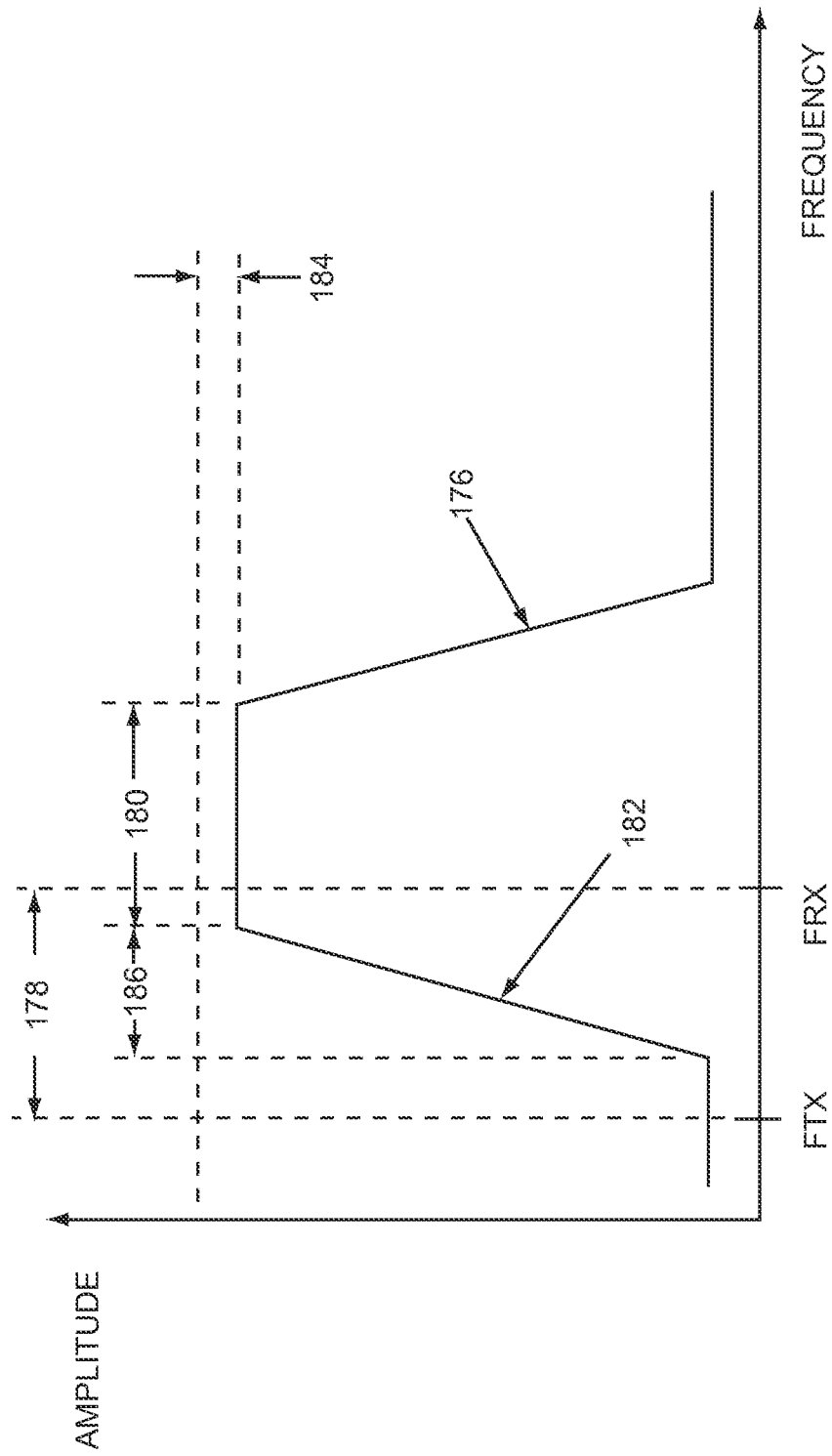
FIG. 31 is a graph showing a bandpass filter response of a receive bandpass filter, which may be used as part of a narrow band duplexer.
Figure 32:
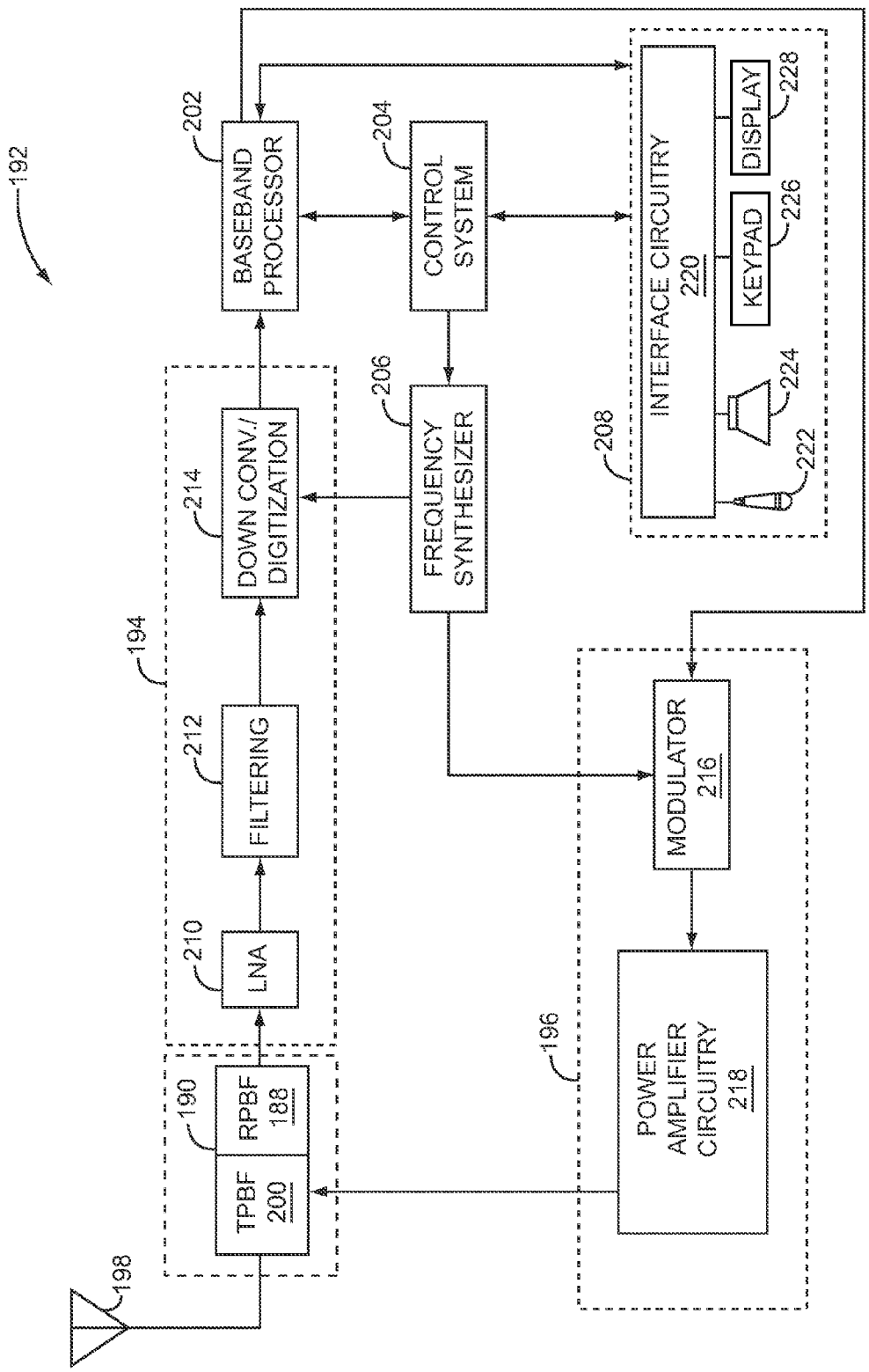
FIG. 32 shows an application example of the present disclosure used in a mobile terminal.

FIG. 31 is a graph showing a bandpass filter response 176 of a receive bandpass filter 188 (FIG. 32), which may be used as part of a narrow band duplexer 190 (FIG. 32). The expanded two-track SAW device 100 illustrated in FIG. 21 may be used in the receive bandpass filter 188 (FIG. 32). The bandpass filter response 176 may be associated with a duplex gap 178, which represents a difference between a transmit frequency FTX and a receive frequency FRX. The bandpass filter response 176 has a passband 180, a transmit side steepness 182, an insertion loss 184, and a transition band 186. In certain narrow band applications, the duplex gap 178 may be fairly narrow. In an exemplary embodiment of the expanded two-track SAW device 100, the duplex gap 178 is about 20 megahertz. The transmit side steepness 182 determines the transition band 186 of the bandpass filter response 176. In general, the steeper the transmit side steepness 182, the narrower the transition band 186. For certain applications, to achieve adequate performance over temperature, process, and other conditions, the transition band 186 may need to be as narrow as possible. In an exemplary embodiment of the expanded two-track SAW device 100, the transition band 186 must be less than or equal to about 13 megahertz from about 3.5 decibels (db) down to less than about 50 db for room temperature. By including the interconnecting grating 102, the insertion loss 184 toward the transmit frequency FTX, the transmit side steepness 182, or both may be improved.

An application example of expanded two-track SAW device 100 is its use as a receive bandpass filter 188, which is used in a narrow band duplexer 190 as part of a mobile terminal 192, the basic architecture of which is represented in FIG. 32. The mobile terminal 192 may include a receiver front end 194, a radio frequency transmitter section 196, an antenna 198, the duplexer 190, which further includes a transmit bandpass filter 200, a baseband processor 202, a control system 204, a frequency synthesizer 206, and an interface 208. The receiver front end 194 receives information bearing radio frequency signals from one or more remote transmitters provided by a base station (not shown). A low noise amplifier (LNA) 210 amplifies the signal and filtering 212 filters the amplified signal. Down conversion and digitization circuitry 214 down converts the filtered, received signal to an intermediate or baseband frequency signal, which is then digitized into one or more digital streams. The receiver front end 194 typically uses one or more mixing frequencies generated by the frequency synthesizer 206. The baseband processor 202 processes the digitized received signal to extract the information or data bits conveyed in the received signal. This processing typically comprises demodulation, decoding, and error correction operations. As such, the baseband processor 202 is generally implemented in one or more digital signal processors (DSPs).

On the transmit side, the baseband processor 202 receives digitized data, which may represent voice, data, or control information, from the control system 204, which it encodes for transmission. The encoded data is output to the transmitter 196, where it is used by a modulator 216 to modulate a carrier signal that is at a desired transmit frequency. Power amplifier circuitry 218 amplifies the modulated carrier signal to a level appropriate for transmission, and delivers the amplified and modulated carrier signal to the antenna 198 through the transmit bandpass filter 200.

A user may interact with the mobile terminal 192 via the interface 208, which may include interface circuitry 220 associated with a microphone 222, a speaker 224, a keypad 226, and a display 228. The interface circuitry 220 typically includes analog-to-digital converters, digital-to-analog converters, amplifiers, and the like. Additionally, it may include a voice encoder/decoder, in which case it may communicate directly with the baseband processor 202. The microphone 222 will typically convert audio input, such as the user's voice, into an electrical signal, which is then digitized and passed directly or indirectly to the baseband processor 202. Audio information encoded in the received signal is recovered by the baseband processor 202, and converted by the interface circuitry 220 into an analog signal suitable for driving the speaker 224. The keypad 226 and display 228 enable the user to interact with the mobile terminal 192, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure. Any two elements that are coupled to one another may be connected to one another in alternate embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A two-track surface acoustic wave (SAW) device comprising:
    a substrate;
    a first SAW track disposed on the substrate, such that the first SAW track has a first acoustic cavity;
    a second SAW track disposed on the substrate and comprising an interconnecting grating, such that the second SAW track has a second acoustic cavity, which is divided into two acoustic cavities by the interconnecting grating, wherein the two acoustic cavities are acoustically coupled to one another;
    a first re-radiation interconnection disposed on the substrate and electrically coupling the first SAW track to the second SAW track;
    a second re-radiation interconnection disposed on the substrate and electrically coupling the first SAW track to the second SAW track; and
    wherein a length of the interconnecting grating is between about sixteen wavelengths and about thirty wavelengths of a surface acoustic wave of the two-track SAW device.

2. The two-track SAW device of claim 1 wherein the second SAW track further comprises a first plurality of inter-digital transducers (IDTs) and a second plurality of IDTs, such that the interconnecting grating is between the first plurality of IDTs and the second plurality of IDTs, and a quantity of IDTs in the first plurality of IDTs is equal to a quantity of IDTs in the second plurality of IDTs.

3. The two-track SAW device of claim 1 wherein a length of the interconnecting grating is greater than one wavelength of a surface acoustic wave of the two-track SAW device.

4. The two-track SAW device of claim 1 wherein;
    the first SAW track comprises:
        a first plurality of inter-digital transducers (IDTs) comprising a first of the first plurality of IDTs, a second of the first plurality of IDTs, and a third of the first plurality of IDTs;
        a first grating; and
        a second grating; and
    the second SAW track comprises:
        a second plurality of IDTs comprising a first of the second plurality of IDTs, second of the second plurality of IDTs, a third of the second plurality of IDTs, and a fourth of the second plurality of IDTs;
        a third grating; and
        a fourth grating.

5. The two-track SAW device of claim 4 wherein the third grating and the fourth grating each have an edge grating periodicity, and the interconnecting grating has an interconnecting grating periodicity, which is less than the edge grating periodicity.

6. The two-track SAW device of claim 4 wherein the first plurality of IDTs further comprises at least five IDTs.

7. The two-track SAW device of claim 4 wherein the second plurality of IDTs further comprises at least six IDTs.

8. The two-track SAW device of claim 4 further comprising:
a first chirping region between the first of the first plurality of IDTs and the second of the first plurality of IDTs;
a second chirping region between the second of the first plurality of IDTs and the third of the first plurality of IDTs;
a third chirping region between the first of the second plurality of IDTs and the second of the second plurality of IDTs; and
a fourth chirping region between the third of the second plurality of IDTs and the fourth of the second plurality of IDTs.

9. The two-track SAW device of claim 1 wherein the two-track SAW device is used in a handpass filter.

10. The two-track SAW device of claim 1 wherein:
the first SAW track comprises:
a first plurality of inter-digital transducers (IDTs) comprising a first of the first plurality of IDTs, a second of the first plurality of IDTs, a third of the first plurality of IDTs, and a fourth of the first plurality of IDTs;
a first grating; and
a second grating; and
the second SAW track comprises:
a second plurality of IDTs comprising a first of the second plurality of IDTs, a second of the second plurality of IDTs, a third of the second plurality of IDTs, and a fourth of the second plurality of IDTs;
a third grating; and
a fourth grating.

11. The two-track SAW device of claim 1 further comprising a first capacitance structure disposed over the substrate, having a first capacitance, and electrically coupled between the first re-radiation interconnection and the second re-radiation interconnection, such that the first capacitance provides a compensation capacitance between the first re-radiation interconnection and the second re-radiation interconnection.

12. The two-track SAW device of claim 11 wherein the first capacitance structure comprises a first plurality of fingers and a second plurality of fingers interleaved with one another to provide the first capacitance, such that the first plurality of fingers is electrically coupled to the first re-radiation interconnection and the second plurality of fingers is electrically coupled to the second re-radiation interconnection.

13. The two-track SAW device of claim 1 further comprising:
an internal ground connection node disposed over the substrate and electrically coupled to the first SAW track;
a first ground crossover interconnection electrically coupled between ground and the internal ground connection node, such that the first ground crossover interconnection and the first re-radiation interconnection have a first overlap region, which has a first overlap capacitance between the first ground crossover interconnection and the first re-radiation interconnection; and
a second ground crossover interconnection electrically coupled between ground and the internal ground connection node, such that the second ground crossover interconnection and the second re-radiation interconnection have a second overlap region, which has a second overlap capacitance between the second ground crossover interconnection and the second re-radiation interconnection.

14. The two-track SAW device of claim 13 wherein a series combination of the first overlap capacitance and the second overlap capacitance provides a compensation capacitance between the first re-radiation interconnection and the second re-radiation interconnection.

15. The two-track SAW device of claim 13 further comprising a first external ground connection node disposed over the substrate and a second external ground connection node disposed over the substrate, such that the first ground crossover interconnection is electrically coupled between the internal ground connection node and the first external ground connection node, and the second ground crossover interconnection is electrically coupled between the internal ground connection node and the second external ground connection node.

16. The two-track SAW device of claim 1 further comprising:
a first capacitance structure disposed over the substrate, having a first capacitance, and electrically coupled between the first re-radiation interconnection and ground; and
a second capacitance structure disposed over the substrate, having a second capacitance, and electrically coupled between the second re-radiation interconnection and ground
wherein a series combination of the first capacitance and the second capacitance provides a compensation capacitance between the first re-radiation interconnection and the second re-radiation interconnection.

17. The two-track SAW device of claim 1 further comprising a 2-port resonator disposed over the substrate and coupled between the first SAW track and the second SAW track via the first re-radiation interconnection and the second re-radiation interconnection, such that the 2-port resonator provides compensation capacitance between the first re-radiation interconnection and the second re-radiation interconnection.

18. A two-track surface acoustic wave (SAW) device comprising:
a substrate;
a first SAW track disposed on the substrate, such that the first SAW track has a first acoustic cavity;
a second SAW track disposed on the substrate and comprising an interconnecting grating, such that the second SAW track has a second acoustic cavity, which is divided into two acoustic cavities by the interconnecting grating, wherein the two acoustic cavities are acoustically coupled to one another;
a first re-radiation interconnection disposed on the substrate and electrically coupling the first SAW track to the second SAW track;
a second re-radiation interconnection disposed on the substrate and electrically coupling the first SAW track to the second SAW track
wherein:
the first SAW track comprises:
a first plurality of inter-digital transducers (IDTs) comprising a first of the first plurality of IDTs, a second of the first plurality of IDTs a third of the first plurality of IDTs;
a first grating; and
a second grating; and
the second SAW track comprises:
a second plurality of IDTs comprising a first of the second plurality of IDTs, a second of the second plurality of IDTs, a third of the second plurality of IDTs, and a fourth of the second plurality of IDTs;
a third grating; and
a fourth grating; and
wherein the third grating and the fourth grating each have an edge grating periodicity, and the interconnecting grating has an interconnecting grating periodicity, which is less than the edge grating periodicity; and
wherein the interconnecting grating periodicity is between about 98 percent and about 100 percent of the edge grating periodicity.

19. A two-track surface acoustic wave (SAW) device comprising:
a substrate;
a first SAW track disposed on the substrate, such that the first SAW track has a first acoustic cavity;
a second SAW track disposed on the substrate and comprising an interconnecting grating, such that the second SAW track has a second acoustic cavity, which is divided into two acoustic cavities by the interconnecting grating, wherein the two acoustic cavities are acoustically coupled to one another;
a first re-radiation interconnection disposed on the substrate and electrically coupling the first SAW track to the second SAW track;
a second re-radiation interconnection disposed on the substrate and electrically coupling the first SAW track to the second SAW track
wherein:
the first SAW track comprises:
a first plurality of in digital transducers (IDTs) comprising a first of the first plurality of IDTs, a second of the first plurality of IDTs, and a third of the first plurality of IDTs;
a first grating; and
a second grating; and
the second SAW track comprises:
a second plurality of IDTs comprising a first of the second plurality of IDTs, a second of the second plurality of IDTs, a third of the second plurality of IDTs, and a fourth of the second plurality of IDTs;
a third grating; and
a fourth grating; and
further comprising:
a first external ground connection node disposed on the substrate;
a second external ground connection node disposed on the substrate;
a first connection node disposed on the substrate;
a second connection node disposed on the substrate; and
a third connection node disposed on the substrate, such that:
each of the first plurality of IDTs comprises an active set of inter-digitated fingers (IDFs) and a grounding set of IDFs, such that:
the grounding set of IDFs of the first of the first plurality of IDTs is electrically coupled to the first external ground connection node;
the active set of IDFs of the first of the first plurality of IDTs is electrically coupled to the first re-radiation interconnection;
the grounding set of IDFs of the second of the first plurality of IDTs is electrically coupled to an internal ground connection node;
the active set of IDFs of the second of the first plurality of IDTs is electrically coupled to the first connection node;
the grounding set of IDFs of the third of the first plurality of IDTs is electrically coupled to the second external ground connection node; and
the active set of IDFs of the third of the first plurality of IDTs is electrically coupled to the second re-radiation interconnection; and
each of the second plurality of IDTs comprises an active set of IDFs and a grounding set of IDFs, such that:
the grounding set of IDFs of the first of the second plurality of IDTs is electrically coupled to the first external ground connection node;
the active set of IDFs of the first of the second plurality of IDTs is electrically coupled to the first re-radiation interconnection;
the grounding set of IDFs of the second of the second plurality of IDTs is electrically coupled to the interconnecting grating;
the active set of IDFs of the second of the second plurality of IDTs is electrically coupled to the second connection node;
the grounding set of IDFs of the third of the second plurality of IDTs is electrically coupled to the internal ground interconnection;
the active set of IDFs of the third of the second plurality of IDTs is electrically coupled to the interconnecting grating;
the grounding set of IDFs of the fourth of the second plurality of IDTs is electrically coupled to the second external ground connection node; and
the active set of IDFs of the fourth of the second plurality of IDTs is electrically coupled to the second re-radiation interconnection.

20. The two-track SAW device of claim 19 wherein:
the third grating is electrically coupled to the first external ground connection node; and
the fourth grating is electrically coupled to the second external ground connection node.

21. The two-track SAW device of claim 20 wherein:
the first grating is electrically coupled to the first external ground connection node and
the second grating is electrically coupled to the second external ground connection node.

22. The two-track SAW device of claim 19 wherein:
the first connection node provides a single-ended input to the two-track SAW device; and
the second connection node and the third connection node provide a differential output from the two-track SAW device.

23. A two-track surface acoustic wave (SAW) device comprising:
a substrate;
a first SAW track disposed on the substrate, such that the first SAW track has a first acoustic cavity;

a second SAW track disposed on the substrate and comprising an interconnecting grating, such that the second SAW track has a second acoustic cavity, which is divided into two acoustic cavities by the interconnecting grating, wherein the two acoustic cavities are acoustically coupled to one another;

a first re-radiation interconnection disposed on the substrate and electrically coupling the first SAW track to the second SAW track;

a second re-radiation interconnection disposed on the substrate and electrically coupling the first SAW track to the second SAW track;

an internal ground connection node disposed over the substrate and electrically couple to the first SAW track;

a first around crossover interconnection electrically coupled between ground and the internal ground connection node, such that the first ground crossover interconnection and the first re-radiation interconnection have a first overlap region, which has a first overlap capacitance between the first crossover interconnection and the first re-radiation interconnection;

a second round crossover interconnection electrically coupled between ground and the internal ground connection node, such that the second ground crossover interconnection and the second re-radiation interconnection have a second overlap region, which has a second overlap capacitance between the second ground crossover interconnection and the second re-radiation interconnection; and a first capacitance structure disposed over the substrate, having a first capacitance, and electrically coupled between the first re-radiation interconnection and the second re-radiation interconnection, such that a series combination of the first overlap capacitance and the second overlap capacitance combined in parallel with the first capacitance provides a compensation capacitance between the first re-radiation interconnection and the second re-radiation interconnection.

24. A two-track surface acoustic wave (SAW) device comprising:
a substrate;
a first SAW track disposed on the substrate, such that the first SAW track has a first acoustic cavity;
a second SAW track disposed on the substrate and comprising an interconnecting grating, such that the second SAW track has a second acoustic cavity, which is divided into two acoustic cavities by the interconnecting grating, wherein the two acoustic cavities are acoustically coupled to one another;
a first re-radiation interconnection disposed on the substrate and electrically coupling the first SAW track to the second SAW track;
a second re-radiation interconnection disposed on the substrate and electrically coupling the first SAW track to the second SAW track
wherein:
the first SAW track comprises:
a first plurality of inter-digital transducers (IDTs) comprising a first of the first plurality of IDTs, a second of the first plurality of IDTs, a third of the first plurality of IDTs, and a fourth of the first plurality of IDTs;
a first grating; and
a second grating; and
the second SAW track comprises:
a second plurality of IDTs comprising a first of the second plurality of IDTs, a second of the second plurality of IDTs, a third of the second plurality of IDTs, and a fourth of the second plurality of IDTs;
a third grating; and
a fourth grating; and
further comprising:
a first external ground connection node disposed on the substrate;
a second external ground connection node disposed on the substrate;
a first connection node disposed on the substrate;
a second connection node disposed on the substrate;
a third connection node disposed on the substrate; and
a fourth connection node disposed on the substrate, such, that:
each of the first plurality of IDTs comprises an active set of inter-digitated fingers (IDFs) and a grounding set of IDFs, such that:
the grounding set of IDFs of the first of the first plurality of IDTs is electrically coupled to the first external ground connection node;
the active set of IDFs of the first of the first plurality of IDTs is electrically coupled to the first re-radiation interconnection;
the grounding set of IDFs of the second of the first plurality of IDTs is electrically coupled to an internal ground connection node;
the active set of IDFs of the second of the first plurality of IDTs electrically coupled to the first connection node;
the grounding set of IDFs of the third of the first plurality of IDTs is electrically coupled to the internal ground connection node;
the active set of IDFs of the third of the first plurality of IDTs is electrically coupled to the fourth connection node;
the grounding set of IDFs of the fourth of the first plurality of IDTs is electrically coupled to the second external ground connection node; and
the active set of IDFs of the fourth of the first plurality of IDTs is electrically coupled to the second re-radiation interconnection; and
each of the second plurality of IDTs comprises an active set of IDFs and a grounding set of IDFs, such that:
the grounding set of IDFs of the first of the second plurality of IDTs is electrically coupled to the first external ground connection node;
the active set of IDFs of the first of the second plurality of IDTs is electrically coupled to the first re-radiation interconnection;
the grounding set of IDFs of the second of the second plurality of IDTs is electrically coupled to the interconnecting grating;
the active set of IDFs of the second of the second plurality of is electrically coupled to the second connection node;
the grounding set of IDFs of the third of the second plurality of IDTs is electrically coupled to the interconnecting grating;
the active set of IDFs of the third of the second plurality of IDTs is electrically coupled to the third connection node;
the grounding set of IDFs of the fourth of the second plurality of IDTs is electrically coupled to the second external ground connection node; and
the active set of IDFs of the fourth of the second plurality of IDTs is electrically coupled to the second re-radiation interconnection.

25. A method for forming a two-track surface acoustic wave (SAW) device comprising:
- disposing a first SAW track on a substrate, such that the first SAW track has a first acoustic cavity;
- disposing a second SAW track on the substrate, such that the second SAW track comprises an interconnecting grating and has a second acoustic cavity, which is divided into two acoustic cavities by the interconnecting grating, wherein the two acoustic cavities are acoustically coupled to one another;
- disposing a first re-radiation interconnection on the substrate, such that the first re-radiation interconnection electrically couples the first SAW track to the second SAW track;
- disposing a second re-radiation interconnection on the substrate, such that the second re-radiation interconnection further electrically couples the first SAW track to the second SAW track; and
- wherein a length of the interconnecting grating is between about sixteen wavelengths and about thirty wavelengths of a surface acoustic wave of the two-track SAW device.

* * * * *

UNITED STATES PATENT AND TRADEMARK OFFICE
CERTIFICATE OF CORRECTION

PATENT NO.         : 8,531,255 B2                                   Page 1 of 1
APPLICATION NO.    : 12/966658
DATED              : September 10, 2013
INVENTOR(S)        : Aleh Loseu It is certified that error appears in the above-identified patent and that said Letters Patent is hereby corrected as shown below:

In the Claims

Column 19, in claim 9, at line 25, change "handpass" to --bandpass--.

Column 21, in claim 19, at line 40, change "in digital" to --inter-digital--.

Column 23, in claim 23, at line 15, change "around" to --ground--; at line 21, change "first crossover" to --first ground crossover--; and at line 23, change "round" to --ground--.

Signed and Sealed this
First Day of April, 2014

Michelle K. Lee
*Deputy Director of the United States Patent and Trademark Office*